(12) United States Patent
Torosyan

(10) Patent No.: US 8,943,117 B1
(45) Date of Patent: Jan. 27, 2015

(54) METHOD AND APPARATUS FOR HYBRID DIGITAL FILTERING

(76) Inventor: Arthur Torosyan, La Crescenta, CA (US)

( * ) Notice: Subject to any disclaimer, the term of this patent is extended or adjusted under 35 U.S.C. 154(b) by 334 days.

(21) Appl. No.: 13/448,374

(22) Filed: Apr. 16, 2012

Related U.S. Application Data

(60) Provisional application No. 61/476,682, filed on Apr. 18, 2011, provisional application No. 61/496,144, filed on Jun. 13, 2011.

(51) Int. Cl.
*G06F 17/10* (2006.01)

(52) U.S. Cl.
USPC ............................ 708/315; 708/319; 708/321

(58) Field of Classification Search
CPC .................................................. H03H 17/0213
USPC ........................................ 708/315, 319, 321
See application file for complete search history.

(56) References Cited

U.S. PATENT DOCUMENTS

| | | | | |
|---|---|---|---|---|
| 5,502,747 | A * | 3/1996 | McGrath ....................... | 375/350 |
| 2008/0126461 | A1 * | 5/2008 | Christoph ...................... | 708/403 |
| 2010/0121617 | A1 * | 5/2010 | Gruener et al. .................... | 703/2 |
| 2010/0235419 | A1 * | 9/2010 | Yamamoto ..................... | 708/300 |

OTHER PUBLICATIONS

A. V. Oppenheim, R W. Schalfer, "Discrete-Time Signal Processing", second edition, Prentice Hall, ISBN 0-13-754920-2, 1999. Chapters 6 and 8 attached.

J.G. Proakis, D.G. Manolakis, "Digital Signal Processing", third edition, Prentice Hall, ISBN 0-13-373762-4, 2006. Chapters 5 and 7 attached.

M. Joho, G. S. Moschytz, "Connecting Partitioned Frequency-Domain Filters in Parallel or in Cascade" in the IEEE Transactions on Circuits and Systems—II: Analog and Digital Signal Processing, vol. 47, No. 8, Aug. 2000.

Z-J Mou, P Dumahel, "Short-Length FIR Filters and Their Use in Fast Nonrecusrive Filtering" in IEEE Transactions on Signal Processing, vol. 39, No. 4, Jun. 1991.

M. J. Narasimha, "Modified Overlap—Add and Overlap—Save Convolution Algorithms for Real Signals" in the IEEE Signal Processing Letters, vol. 13, No. 11, Nov. 2006.

D. A. Parker, K. K. Parhi, "Low-Area/Power Parallel FIR Digital Filter Implementations," in Journal of VLSI Signal Processing 17, 75-92, 1997.

* cited by examiner

*Primary Examiner* — Chuong D Ngo
(74) *Attorney, Agent, or Firm* — Denis Khoo

(57) ABSTRACT

New hybrid filters are presented based on time and transform domain structures. The hybrid filters have a combined benefit from the advantages obtained by the time and transform domain structures. The overall efficiencies are drawn from combining the pre- and post-processing of the time domain and block based transform domain structures. Further improvements are obtained by interchanging block construction and transforms with linear operations in the pre- and post-processors. The hybrid structures apply to single input, single output, multiple input, and multiple output structures. For the multi input and multi output structures further improvements are obtained by having common processing blocks for the input(s) and common processing blocks for the output(s). They hybrid filters are also efficient in topologies where filter outputs are combined via linear operation(s) generating combined results. The efficiencies of the new hybrid filter may lead to significant fardware, power, silicon area, or somputational savings.

8 Claims, 32 Drawing Sheets

METHOD AND APPARATUS FOR HYBRID DIGITAL FILTERING

This application claims the benefit of and priority of U.S. Provisional Patent Application Ser. No. 61/476,682, entitled "Efficient Filter Structures" by Arthur Torosyan, filed on Apr. 18, 2011 and U.S. Provisional Patent Application Ser. No. 61/496,144, entitled "Method and Apparatus for Filter Implementations" by Arthur Torosyan, filed on Jun. 13, 2011. Provisional Patent Applications 61/476,682 and 61/496,144 are incorporated by reference.

BACKGROUND OF THE INVENTION

1. Field of the Invention

The present invention relates generally to a Signal Processing, and more particularly, to a Digital Filtering.

2. Description of the Related Art

A digital filter receives an input sequence of samples denoted by x(n) and performs a convolution with the filter's impulse response denoted by h(n) to produce the filtered output y(n). When the filter's impulse response is finite in duration, the filter is referred to as a Finite Impulse Response (FIR) filter. When the filter's impulse response is infinite in duration, the filter is referred to as an Infinite Impulse Response (IIR) filter.

The filtering operation for an FIR filter with impulse response h of length M can be expressed mathematically as $$y(n) = \Sigma_{k=0}^{M-1} h(k) \times (n-k) \quad (1)$$

There are two conventional methods for implementing the filter in (1). These two methods, which are outlined below are the time-domain and transform domain methods. The time domain methods process the signal in the time domain, while the transform domain methods transform the input signal to another domain, usually frequency domain, and perform the equivalent of the filtering operation in the transform domain, and then transform the result back to the original domain of the signal, usually the time domain. The transform used to convert a signal from the domain of the input signal to another domain is referred to as the input transform. The transform used to convert a signal from some domain to the domain of the output signal, is referred to as the output transform. In general the input and output domains are the same, which makes the input transform and output transform to be the inverse of each other.

Time-Domain Structures

The two traditional structures for implementing the FIR filter (1) in time domain are the direct form and transposed form. These structures can be found in Proakis et. al. (J. G. Proakis, D. G. Manolakis, "Digital Signal Processing", third edition, Prentice Hall, ISBN 0-13-373762-4) and Oppenheim et. al. (A. V. Oppenheim, R W. Schalfer, "Discrete-Time Signal Processing", second edition, Prentice Hall, ISBN 0-13-754920-2). Efficiencies can be introduced to the structures in the form of reducing the number of multipliers when the impulse response of the filter is symmetric (h(0)=h(M−1), and in general h(n)=h(M−n−1)) or antisymmetric (h(0)=−h(M−1), and in general h(n)=−h(M−n−1)). The structures that take advantage of the symmetry or anti-symmetry of the inpulse response are also illustrated in Proakis et. al. and Oppenheim et. al. Other time domain structures to bring efficiencies to the filter implementation are also known that are based on performing some pre-processing on the input, performing sub-filtering on the pre-processed signals, and post processing the sub-filtered singals to generate the output. These techniques are described in Parket et. al. (D. A. Parker, K. K. Parhi, "Low-Area/Power Parallel FIR Digital Filter Implementations," in Journal of VLSI Signal Processing 17, 75-92, 1997) and Mou et. al. (Z-J Mou, P Dumahel, "Short-Length FIR Filters and Their Use in Fast Nonrecusrive Filtering" in IEEE TRANSACTIONS ON SIGNAL PROCESSING, VOL. 39, NO. 4, JUNE 1991). In this technique, the overall throughput rate of the input to the pre-processor is generally lower than the overall throughput rate at the output of the pre-processor. For example if the sampling rate of the pre-processor input(s) and output(s) is the same, then usually the number of output streams will be greater than the number of input streams. The input signal to the pre-processor can be contained in one stream (i.e., one signal) and passed to the pre-processor as a single input or it can be contained in multiple streams (i.e., multiple signals), but collectively representing the same input signal. For example a time domain signal can be passed to the pre-processor as a single input, or it can be passed in two distinct streams as two distinct signals, the first stream being comprised of all the even-time samples (0, 2, 4, 6, . . . ) of the input signal, while the second stream being comprised of all the odd-time samples (1, 3, 5, 7, . . . ) of the input signal. It is also possible to construct signals that share common components, but collectively represent the input signal. Therefore, in general the pre-processor introduces some redundancy in representing the input signal, which may seem inefficient, but this redundancy enables breaking of the overall filtering operation into sub-filters to operate on the multiple streams produced by the pre-processor. The sub-filters operating on the pre-processor output(s) are derived from the original filter, where these sub-filters have impulse responses that may be shorter than the original filter. Finally the outputs of the sub-filters get combined in post processing to construct what would be the filter output. The general properties of the post-processor with respect to relationship of its input(s) and output(s) are the reverse of those of its corresponding pre-processor. It can be thought of removing the redundancy from the sub-filtered signals (which is related to the redundancy introduced by the pre-processor) to construct the output signal. Again the output signal can be presented at the output of the post-processor as a single stream (i.e., one signal) or multiple streams collectively representing the otput signal. The efficiency in this technique comes from the fact that the sub-filters are shorter (requiring less processing) and they operate at lower sampling rates compared to the overall sampling rate of the input (which, in a hardware implementation translates to power savings and/or hardware savings when resources are shared to perform the computations). There are different decompositions of the filter into sub-filters that yield different pre-processing and post-processing structures, different number of sub-filters, different impulse response lengths, and different processing speeds for the sub-filters. We will refer to the family of these filters as Reduced-Complexity N-Parallel (RCNP) filter structures. Two example structures for the RCNP decompositions that create 3 sub-filters are shown in FIG. 2a and FIG. 2b. In FIG. 2a the input signal is processed by the pre-processor 210, generating the three streams, each of which are processed by the sub-filters 221 222 223, and the outputs of the sun-filters are processed by the post-processor 230 to generate the output signal. The sub-filters 221 222 223 are processing at half the rate of the original filter. Similarly FIG. 2b depicts a structure with a pre-processor 240, sub-filters 251 252 253, and a post processor 260. Note that the same (or different) decomposition can be also applied to each of the sub-filters h0, h0+h1, and h1. Here h0 denotes the impulse response h0(n)=h(2n) (i.e., the even-indexed samples of h), h1(n)=h(2n+1) (i.e., the odd-indexed samples of h), and h0+h1 is h0 (n)+h1(n). If h has an even length, then h0, h1, and h0+h1, will all have half the length of h. The efficiencies are drawn from the facts that these sub-filters are half the length of h AND they operate at half the rate of h. For example, using power consumption as the resource of interest, if h0, h1, and h0+h1, each consume ¼ of the power consumed by h, then collectively they consume ¾ of the power consumed by h. Assuming the pre- and post-processing consumes negligible power, this particular RCNP decomposition will yield approximately 25% power savings.

Transform-Domain Structures

In addition to time domain techniques, there are known transform domain techniques, referred to as overlap-and-add and overlap-and-save that are described in Proakis et. al. and Oppenheim et. al. The efficiencies in these transform domain structures come from the fact that the filtering operations process a block of input samples and/or generate a block of output samples at a time. This means the operations performed are shared for the processing of all input samples in the block and/or generation of all samples in the output block.

Let us assume the filter implemented by the overlap-and-save method has an impulse response h of length M. Then we define a vector $\bar{h}$ having length T=L+M−1, where $\bar{h}$ is obtained from h by taking the impulse response h and appending it with L−1 zeros. The result is the vector $\bar{h}$ of length T whose first M samples are those of h and last L−1 samples are zeros. $\bar{h}$ is the zero-padded version of h. Then we obtain the vector H of length T by taking the T-point transform, commonly the Fast Fourier Transform (FFT) of the zero-padded vector $\bar{h}$. The vector H does not change from iteration to iteration when the filter's impulse response it not changing, rather the filter is operating on the filter's input stream. The vector H needs to change only when the filter coefficients (i.e., the impulse response h) needs to change. Assume the vectors are column vectors with the top element corresponding to the earliest element while the bottom element corrsponding to the latest element. To process the input signal using the overlap-and-save method, a vector $\bar{x}$ of length T at iteration t is constructed by taking the last (or bottom) M−1 samples from the vector $\bar{x}$ at the previous iteration t−1 and positioning these M−1 samples as the first (or top) M−1 samples of $\bar{x}$ and filling the rest of the L samples from the next L samples of the filter's input stream to complete the T samples of $\bar{x}$. The construction of the block $\bar{x}$ from the stream x is accomplished by the input stream to block constructor 310 in FIG. 3. Note that at each iteration we take L samples from the filter's input stream. With these definitions of $\bar{x}$ and H, the filter generates L samples for the filter output as follows. $\bar{x}$ is passed to an input transform 320 in FIG. 3 (T-point FFT) which generates the T-point vector X. Then X and H are processed with the equivalent of the filtering operation in the transform domain, which for the FFT the X and H are multiplied element-by-element 360 in a transform domain processor 330 to generate the T-point vector Y. Then Y is passed to an output transform 340 (T-point Inverse Fast Fourier Transform (IFFT)) to generate the T-point vector $\bar{y}$. Discarding the first (or top) M−1 points of $\bar{y}$, the remaining last (or bottom) L points of $\bar{y}$ produce the L output samples of the filter in the stream y, which is accomplished in the output block to stream constructor 350 in FIG. 3. This processed is repeated again to process the next set of L input samples and generate the next set of L output samples. It should also be noted that for the very first iteration zeros are used for the first (or top) M−1 samples for $\bar{x}$.

The overlap-and-add method is similar to the overlap-and-save, in the sense that it also processed a block of input samples to generate a block of output samples. The main difference is that in the overlap-and-add method the input vector $\bar{x}$ is constructed by taking L samples from the filter's input stream and zero padding it with M−1 zeros. On the contrary, at the output, the first M−1 points are added with the last M−1 points of the previous iteration. For more details one may refer to Proakis et. al. and Oppenheim et. al. Both the overlap-and-add and the overlap-and-save methods can be depicted as in FIG. 3, where the FFT 320, element-by-element multiplication 360 in the trnsform domain processor 330, and IFFT 340 operate on vectors (or blocks of samples). Note that in some implementations of these blocks the block operations can be done in sequence, but the overall operations accomplish the equivalent of the vector (or block) operations.

The overlap-and-add and overlap-and-save methods described in Proakis et. al. and Oppehheim et. al. use a transform size that is larger than the impulse response of the filter. A technique of partitioning the filter up and applying the transform domain filter (overlap-and-add or overlap-and-save) is shown in Joho et. al. (M. Joho, G. S. Moschytz, "Connecting Partitioned Frequency-Domain Filters in Parallel or in Cascade" in the IEEE TRANSACTIONS ON CIRCUITS AND SYSTEMS—II: ANALOG AND DIGITAL SIGNAL PROCESSING, VOL. 47, NO. 8, AUGUST 2000) where the FFT size can be shorter than the filter impulse response. This technique is based on partitioning the impulse response into sections of length P, where the first P samples of h constitute $h^0$ the next P samples constitute $h^1$ and so on. It should also be noted that if the filter h has a length that is not a multiple of P, it can be extended by zero padding to have a length that is multiple of P. The key observation is that now the broken up impulse responses each can be implemented via transform domain implementation, and the transform size needs to be greater than P (not M) and P can be made arbitrarily small. Furthermore, the transforms required for each section of the filter can be shared, so only one forward and/or one inverse transform needs to be implemented. This technique, and the derivations of the structures based on this technique are found in Joho et. al. and we will refer to them as the Partitioned Time Domain (PTiD) and the Partitioned Transform Domain (PTrD) structures. FIG. 4a shows an examplary filter having an impulse response of length M=NP, while FIGS. 4b and 4c, show the corresponding Partitioned Time Domain (PTiD) and the Partitioned Transform Domain (PTrD) structures, respectively, where N=4. The examples in FIGS. 4b, and 4c correspond to the choice of M=4P (i.e., N=4). This choice is for illustration purposes only and the present invention applies to an arbitrary choices for M, P, and N. The PTrD example structure of FIG. 4c is comprised of input stream to block constructor 401, the input transform 402, the partitioned transform domain processor 413, the output transform 414, and the output block to stream constructor 415. The partitioned transform domain processor 413 is comprised of block delays 403 404 405, element-by-element multipliers 406 407 408 409 operating on blocks, one for each partition, and block combiners 410 411 412 to produce the output block of the partitioned transform domain processor 413. A functionally equivalent but alternative structure to FIG. 4c is obtained by applying transposition to the partitioned transform domain processor 413. The resulting PTrD structure is depicted in FIG. 4d, where the partitioned transform domain processor 453 is obtained by transposing the transform domain processor 413 in FIG. 4c. The PTrD structure of FIG. 4d is comprised of input stream to block constructor 441, the input transform 442, the partitioned transform domain processor 453, the output transform 454, and the output block to stream constructor 455. The partitioned transform domain processor 453 is comprised of block delays 447 448 449, element-by-element multipliers 443 444 445 446 operating on blocks, one for each partition, and block combiners 450 451 452 to produce the output block of the partitioned transform domain processor 453. The more general representation of the PTrD structures are depicted by FIG. 4e and FIG. 4f, where N partitions are used. The PTiD structure of FIG. 4b also has it's equivalent structure based on transpotion and can also be generalized similarly to how FIG. 4e and FIG. 4f are generalized.

SUMMARY OF THE INVENTION

Efficient implementations of digital filters play an important role in applications utilizing digital signal processing. Embodiments of a digital filter is disclosed, that relate to utilizing the time and transform domain structures to produce new hybrid filters and numerous variations of the hybrid filters. With a certain set of parameter choices these hybrid structures may benefit from the efficiencies of both the time and transform domain structures. Additionally, the present invention will show to those skilled in the art how to manipulate the various structural elements of the resulting hybrid filter to further increase the benefits obtained from the overall hybrid structure. These structural manipulations, for example, may yield hardware reduction, power reduction, and other resource savings.

BRIEF DESCRIPTION OF THE DRAWINGS

A more complete appreciation of the invention and many of the advantages thereof will be readily obtained as the same becomes better understood by reference to the detailed description when considered in connection with the accompanying drawings, wherein.

DETAILED DESCRIPTION

In embodiments of the present invention, the time and transform domain structures are utilized to produce new hybrid filters and numerous variations of the hybrid filters.

Figure 1:
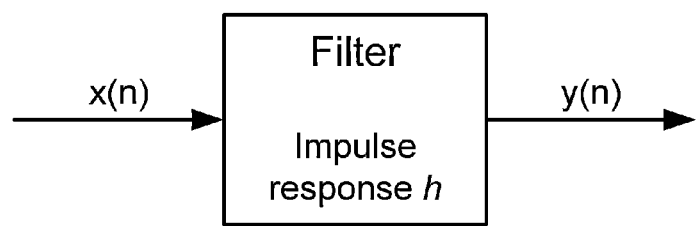
FIG. 1 is a prior art schematic block diagram of a general digital filter.
Figure 2A:
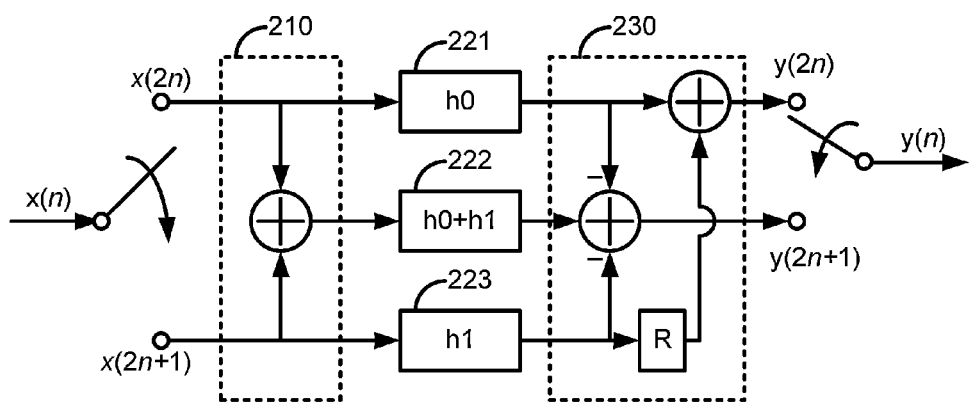
FIG. 2a is a prior art schematic block diagram of a time-domain structure digital filter.
Figure 2B:
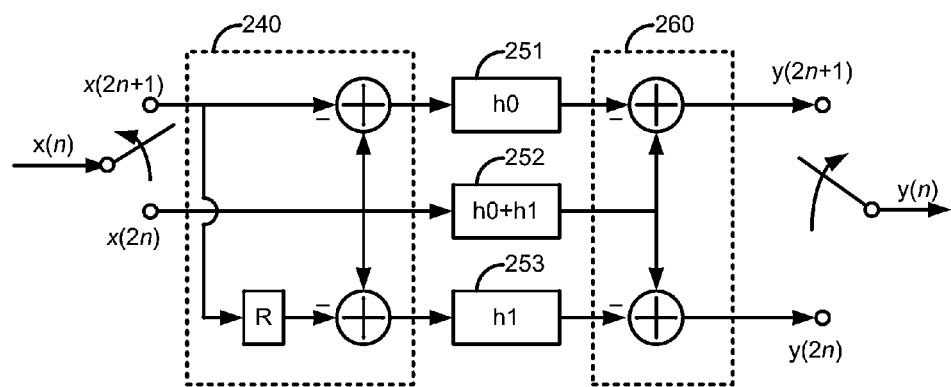
FIG. 2b is a prior art schematic block diagram of a time-domain structure digital filter.
Figure 3:
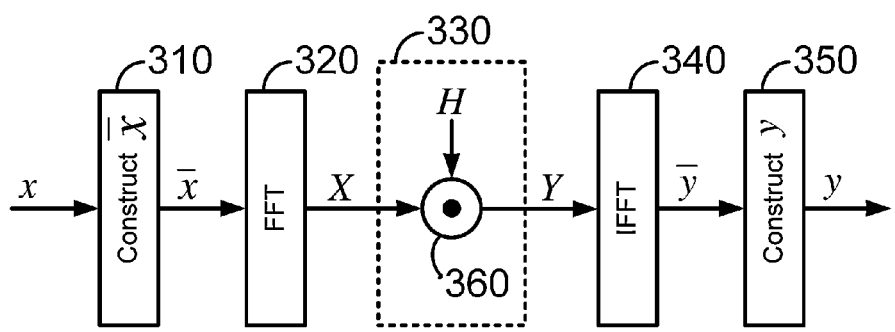
FIG. 3 is a prior art schematic block diagram of a transform-domain structure digital filter.

Without loss in any generality, for illustration purposes, we will use the examples in FIG. 2, FIG. 3, and FIG. 4, but the methods are not limited to the specific configurations of these figures, rather they are general and apply to any desired choice of design parameters. Furthermore, the terms vector and block can be used interchangeably and their meaning should be clear to one skilled in the art.

The illustration is done for filters that are not interpolating or decimating, but the derivation can be extended for such filters without loss in generality. Also, we use the (Fast Fourier Transform) FFT as the input transform and (Inverse Fast Fourier Transform) IFFT as the output transform for illustration purposes. The techniques shown here also apply when other input and output transforms are used, such as the Discrete Fourier Transform (DFT and IDFT), the Discrete Cosine Transform (DCT and IDCT), Discrete Sine Transform (DST and IDST), or others. Furthermore, input and output transforms may be interchanged.

Single Input Single Output Hybrid Filters

In an embodiment of the present invention, the transfer domain filtering will be applied to one or more of the sub-filters of the time domain RCNP filter of FIG. 2a. The transform domain technique depicted in FIG. 3 can be applied to any one or all of the sub-filters of the time domain RCNP structures. One may refer to Parket et. al., Mou et. al., for examples of RCNP structures with their sub-filters that fall in the categories exemplified by FIGS. 2a and 2b. The transform domain technique may be applied to one, multiple, or all sub-filters. If the transform domain technique is applied to some but not all sub-filters, the time and transform domain techniques may yield different delays (processing and algorithmic) in which case these delay differences may need to be equalized before the output is reconstructed.

Figure 4A:
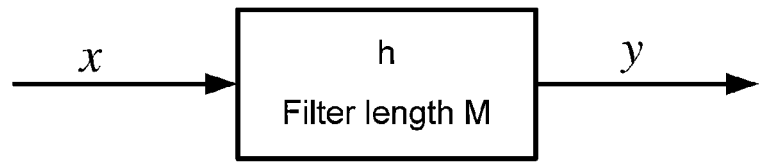
FIG. 4a is a prior art schematic block diagram of a digital filter.
Figure 4B:
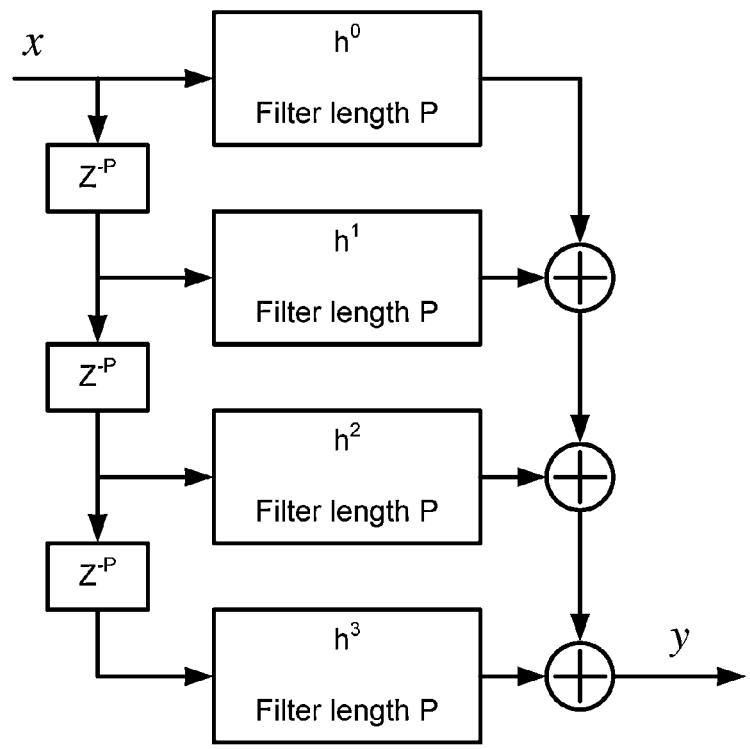
FIG. 4b is a prior art schematic block diagram of a partitioned time domain structure digital filter.
Figure 4C:
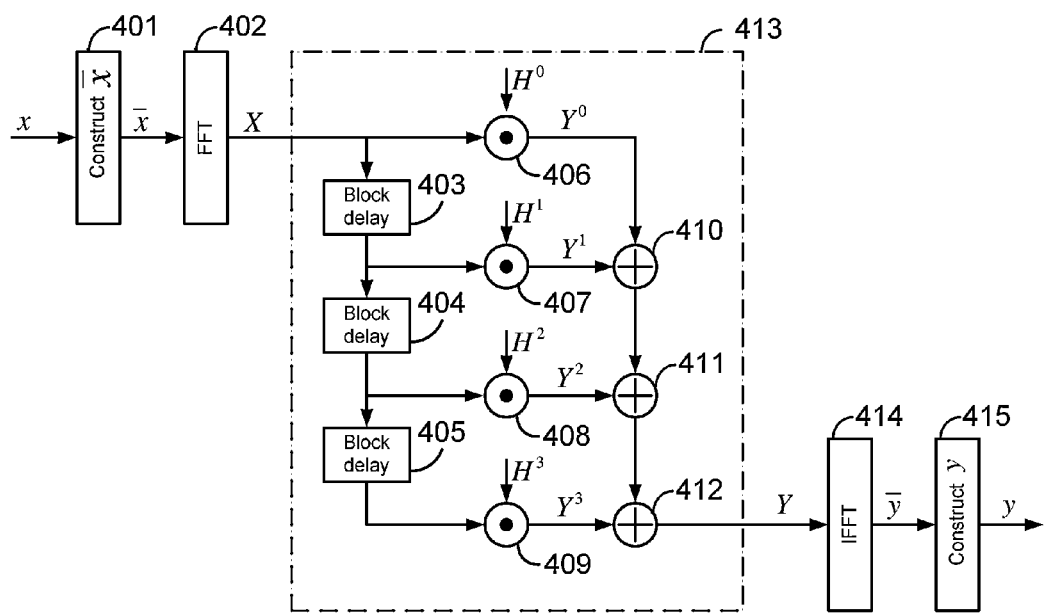
FIG. 4c is a prior art schematic block diagram of a partitioned transform domain structure digital filter.
Figure 4D:
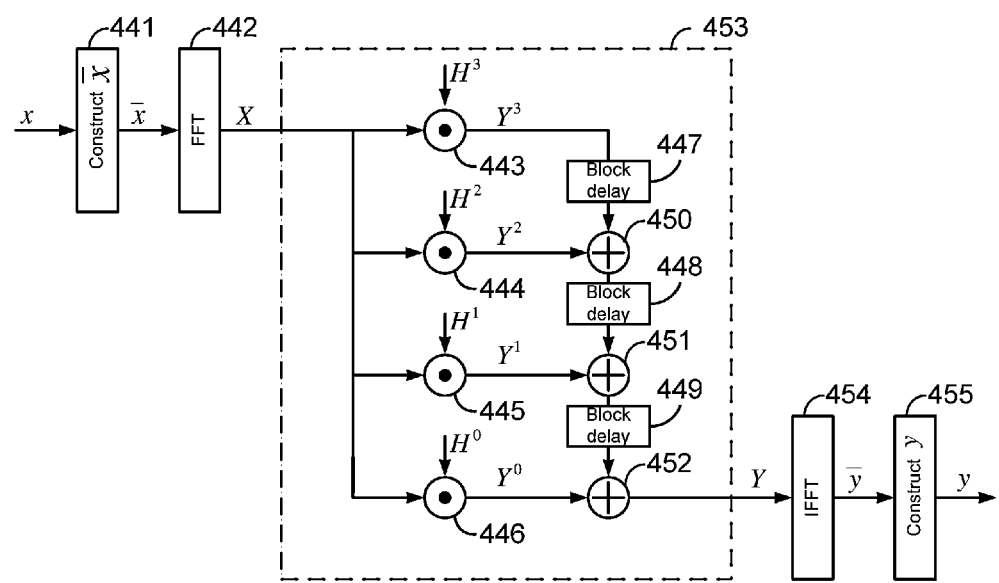
FIG. 4d is a prior art schematic block diagram of a partitioned transform domain structure digital filter.
Figure 4E:
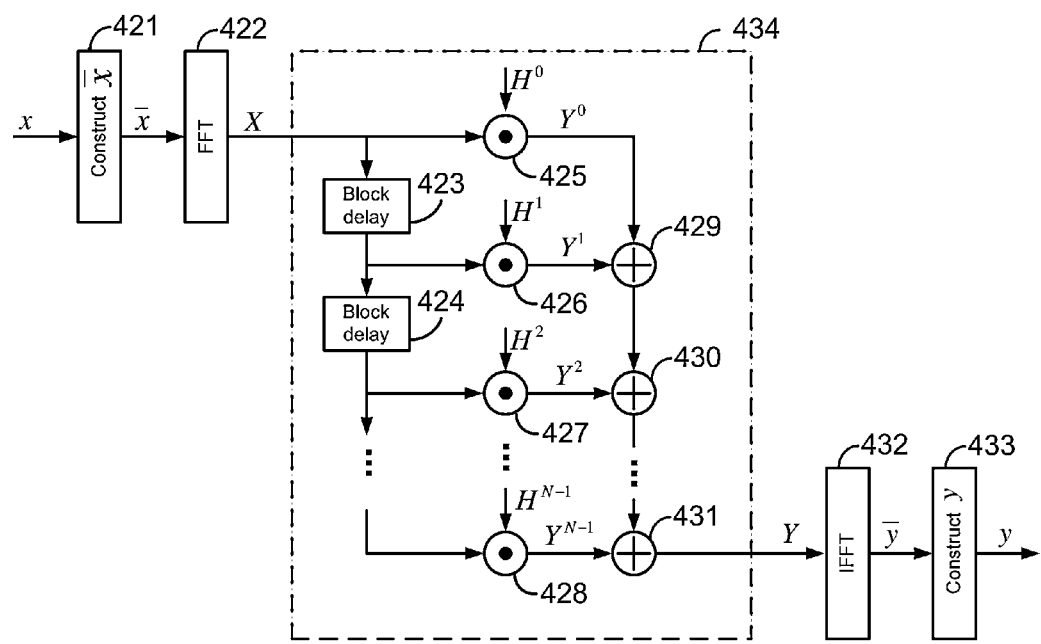
FIG. 4e is a prior art schematic block diagram of a partitioned transform domain structure digital filter.
Figure 4F:
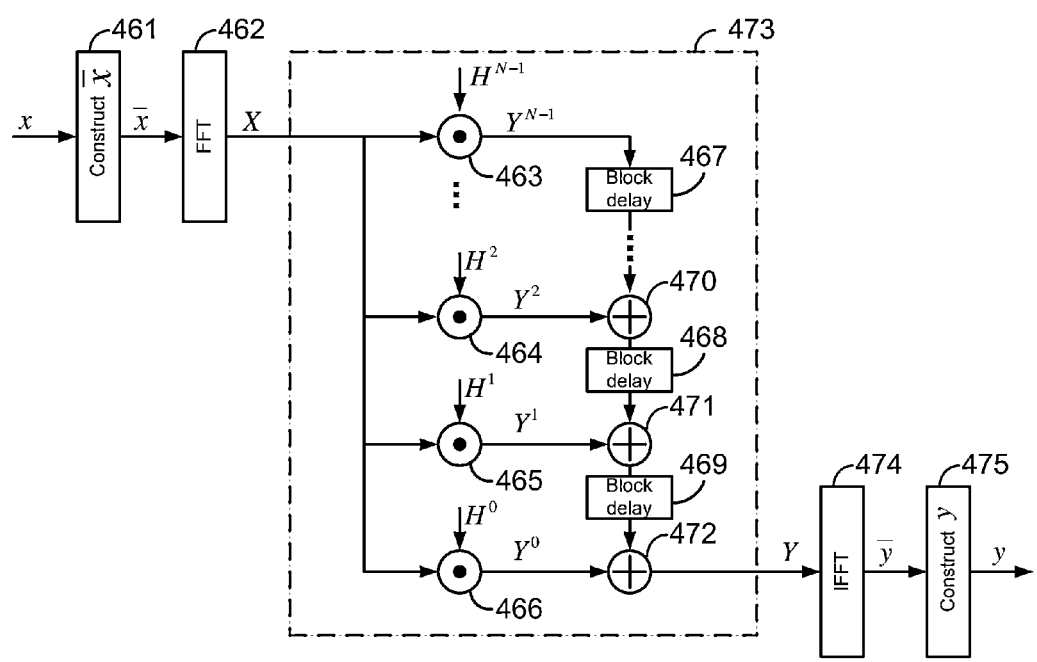
FIG. 4f is a prior art schematic block diagram of a partitioned transform domain structure digital filter.
Figure 5:
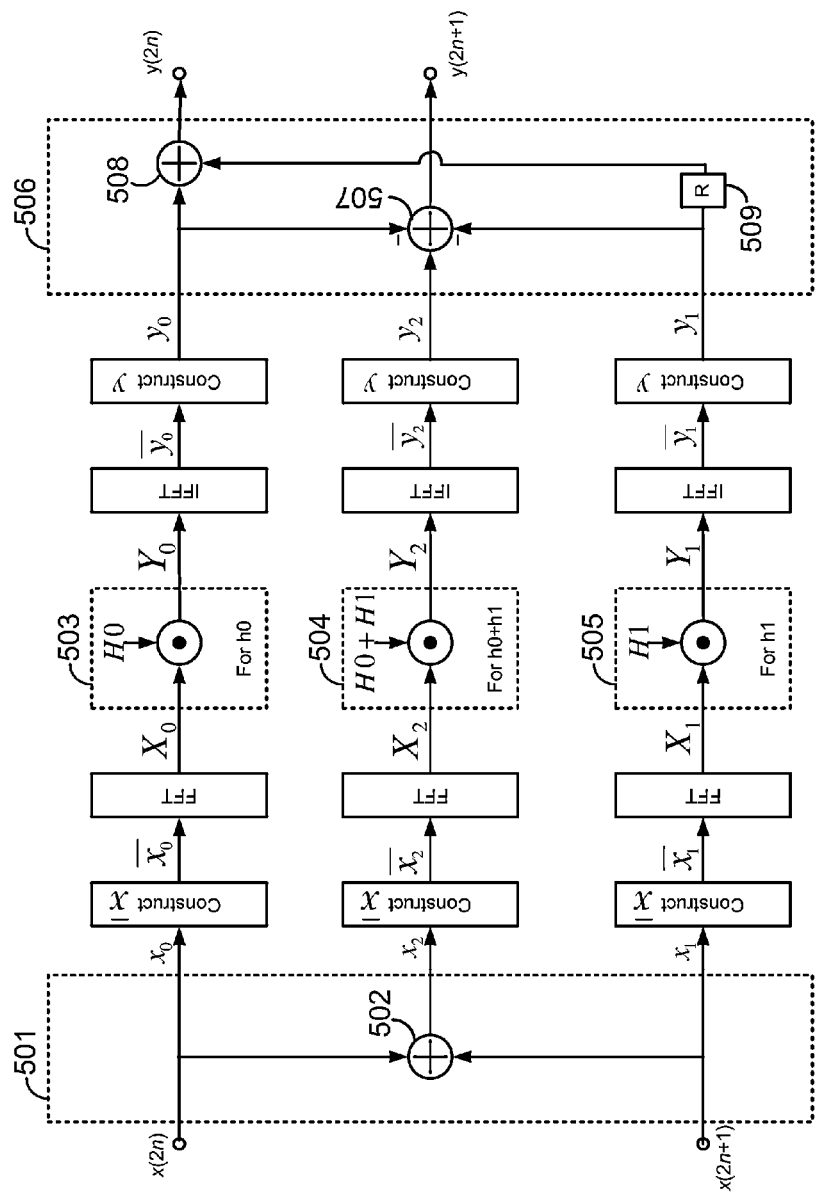
FIG. 5 is a schematic block diagram of a first embodiment of a hybrid digital filter.
Figure 5A:
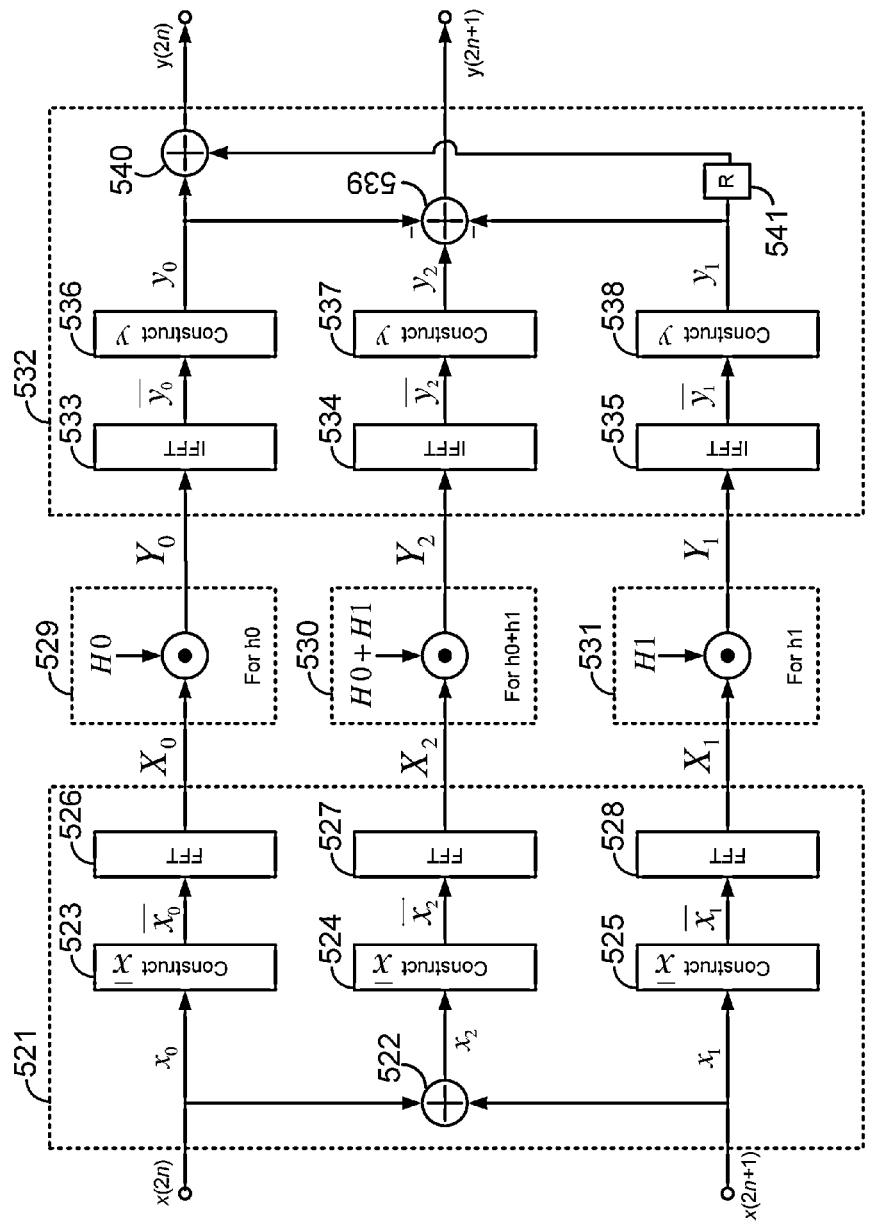
FIG. 5a is a schematic block diagram of a regrouped first embodiment of a hybrid digital filter.
Figure 6:
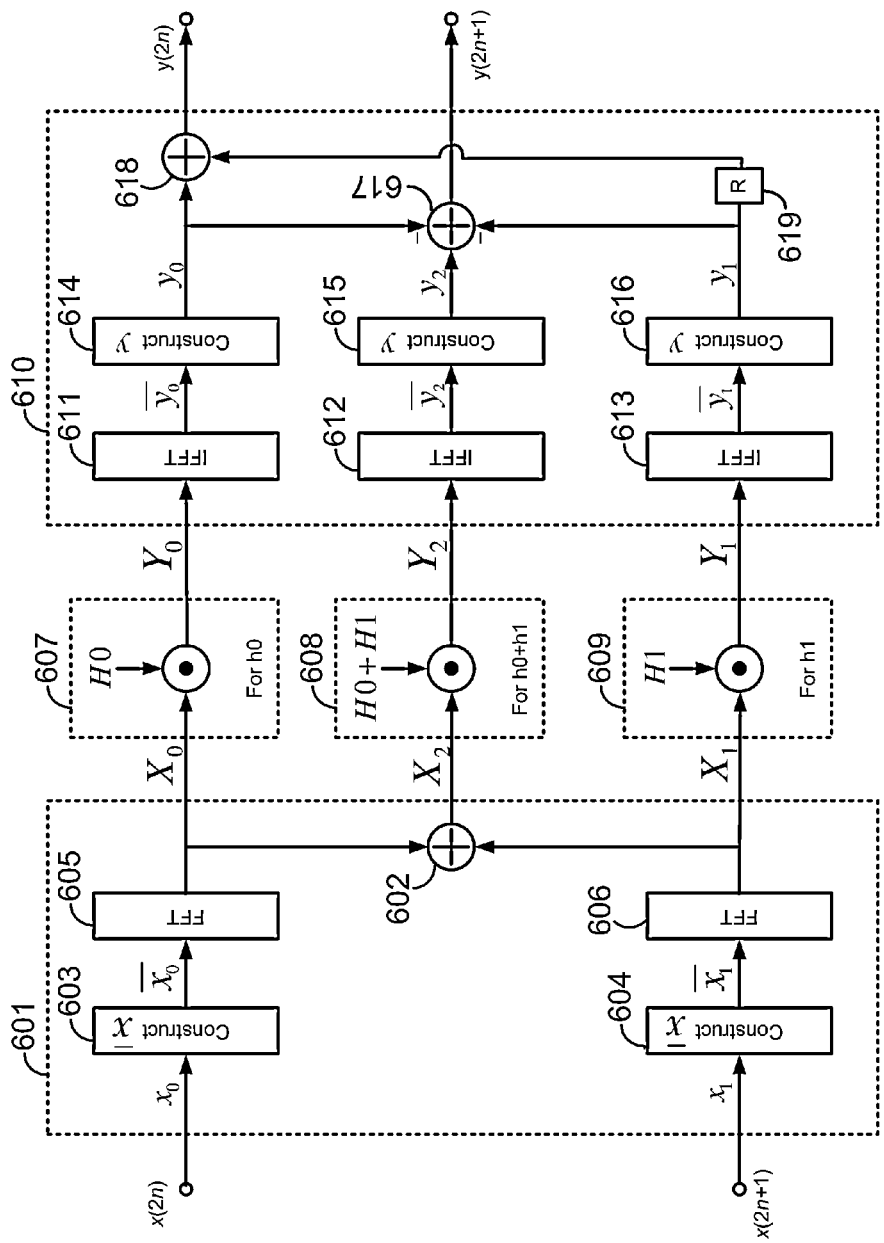
FIG. 6 is a schematic block diagram of an optimized version of the first embodiment of a hybrid digital filter.

FIG. 5 illustrates the application of the transform domain filtering technique depicted in FIG. 3 to all the sub-filters h0, h0+h1, and h1 of RCNP structure of FIG. 2a. The resulting structure in FIG. 5 is comprised of a pre-processor 501, a post processor is 506, and each one of the transform domain filters applied to the sub-filters includes a transform domain processor 503 504 505. The pre-processor 501 is comprised of at least one linear operator 502 and the post-processor 506 is comprised of at least one linear operator 507 508. Note again that in this example we applied the transform domain filter to all sub-filters. One can apply the transform domain filter to just one sub-filter. FIG. 5a illustrates the resulting structure of FIG. 5 grouped into a hybrid pre-processor 521, transform domain processors 529 530 531, corresponding to each sub-filter of RCNP structure of FIG. 2a, and a hybrid post-processor 532. The pre-processor 521 is comprised of at least one linear operator 522 corresponding to the pre-processing 210 of the related RCNP structure in FIG. 2a. In FIG. 5a we have chosen to include the input stream-to-block constructors 523 524 525 and input transforms 526 527 528 in the hybrid pre-processor 521 to illustrate an optimization of this hybrid pre-processor structure. The hybrid post-processor 532 includes at least one linear operator 539 540 corresponding to the post-processing 230 of the related RCNP structure in FIG. 2a. The operations in the post-processors 506 532 are related to the operations performed in the pre-processors 501 521. The example post-processors 506 of FIGS. 5 and 532 of FIG. 5a also include at least one delay element 509 and 541. In FIG. 5a we have chosen to include the output transforms 533 534 535 and the output stream constructors 536 537 538 in the hybrid post-processor 532. The hybrid structures in FIG. 5 and FIG. 5a benefit from both transform domain and time domain RCNP structures, but they can be further optimized by using the fact that the input transform (the FFT in this example) is a linear operation. The resulting optimized hybrid structure is depicted in FIG. 6. The linear property of the input transform allows the input block constructors 523 524 525 and the input transforms 526 527 528 to be pushed towards the input to operate on the input streams, and then the resulting vectors to be passed directly to the H0 transform domain processor 607 and H1 transform domain processor 609, while for the H0+H1 transform domain processor 608 they will be combined in vector mode by performing element-by-element addition 602 in FIG. 6. Pushing the input block constructors 523 524 526 in FIG. 5a towards the input yields the input block constructors 603 604 in FIG. 6 and pushing the input transforms 526 527 528 in FIG. 5a towards the input yields the input transforms 605 606 in FIG. 6. This optimization eliminates 1 transform block and 1 constructor block to produce the optimized hybrid pre-processor 601 and replaces the single element adder 522 with an element-by-element vector adder 602. It should also be noted that the single element adder 522 operates at the input stream rate, while the vector adder 602 operates at the vector update rate, which is slower than the input stream rate, but includes addition for each element of the vector. The new hybrid filter structures depicted in FIGS. 5, 5a, and 6 differ from all prior art structures depicted in FIG. 1 through 4, by combining the RCNP and transform domain structures. The new hybrid filter structures are differentiated by prior art structures by including:

1. at least one linear operator within the pre-processor [502 within 501 in FIG. 5, 522 within 521 in FIG. 5a, and 602 within 601 in FIG. 6];
2. at least one transform domain processor [503 504 505 in FIG. 5, 529 530 531 in FIG. 5a, and 607 608 609 in FIG. 6];
3. at least one linear operator within the post-processor [507 508 within 506 in FIG. 5, 539 540 within 532 in FIG. 5a, and 617 618 within 610 in FIG. 6].

Figure 7:
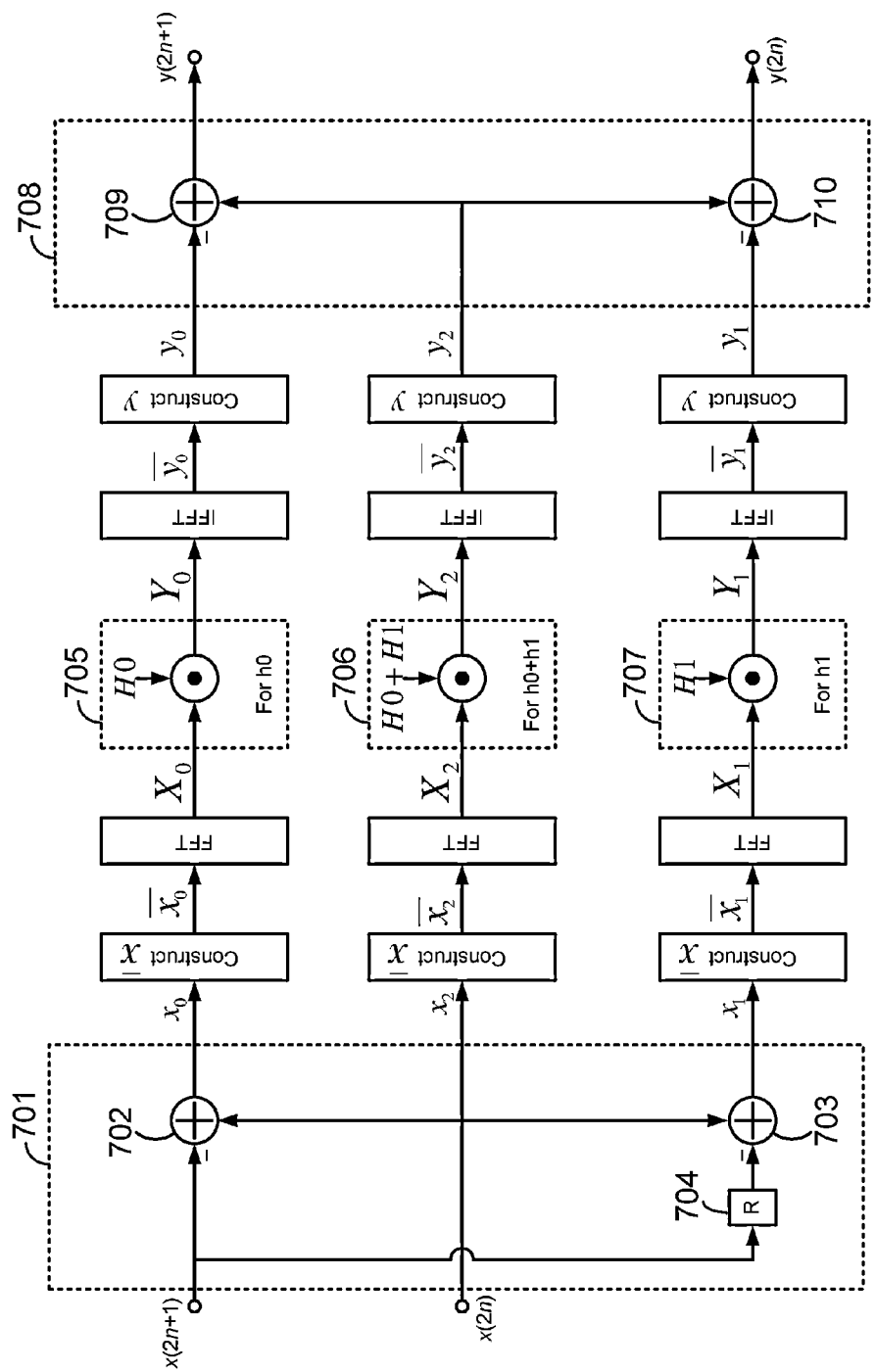
FIG. 7 is a schematic block diagram of a second embodiment of a hybrid digital filter.
Figure 7A:
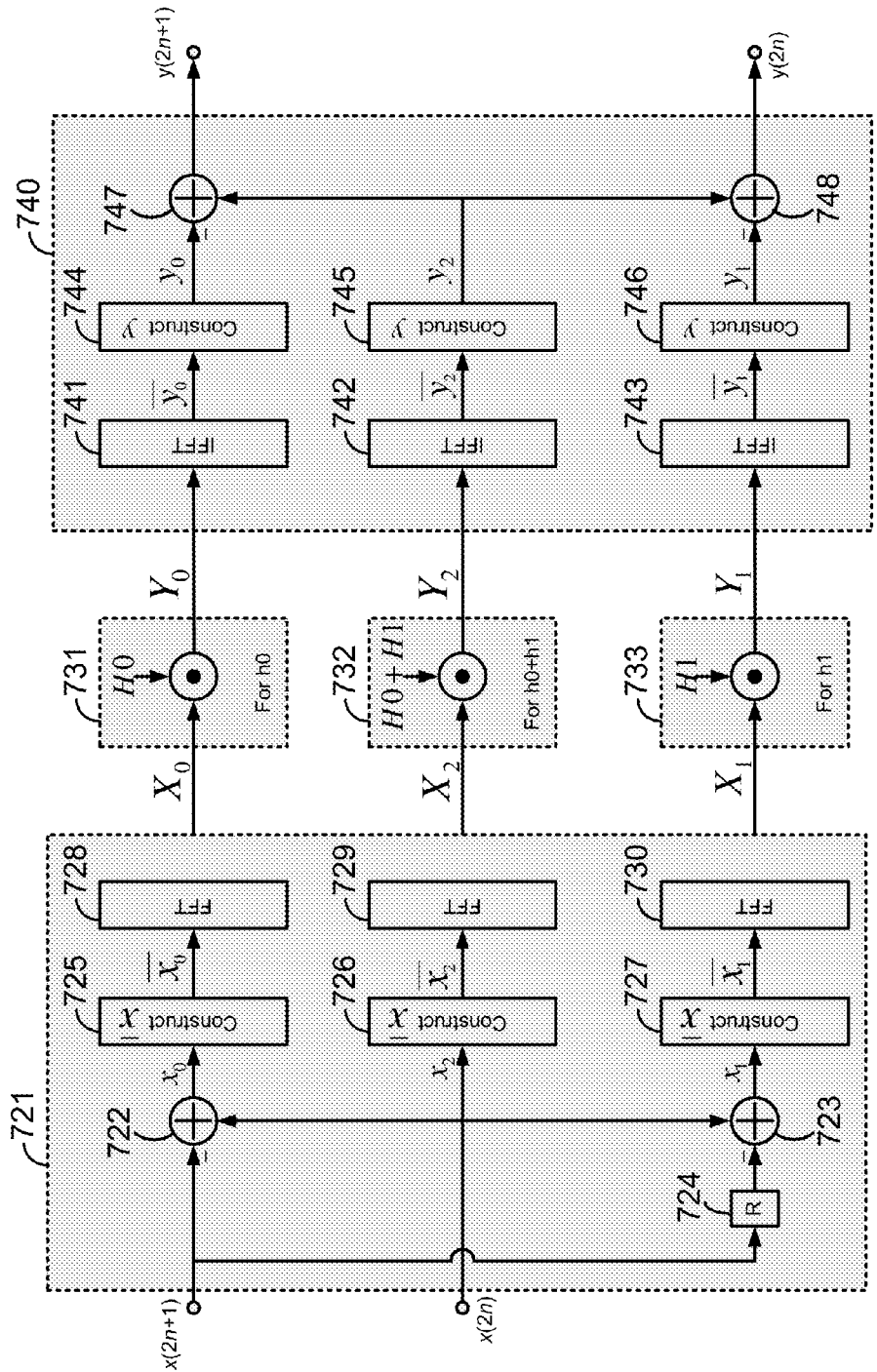
FIG. 7a is a schematic block diagram of a regrouped second embodiment of a hybrid digital filter.
Figure 8:
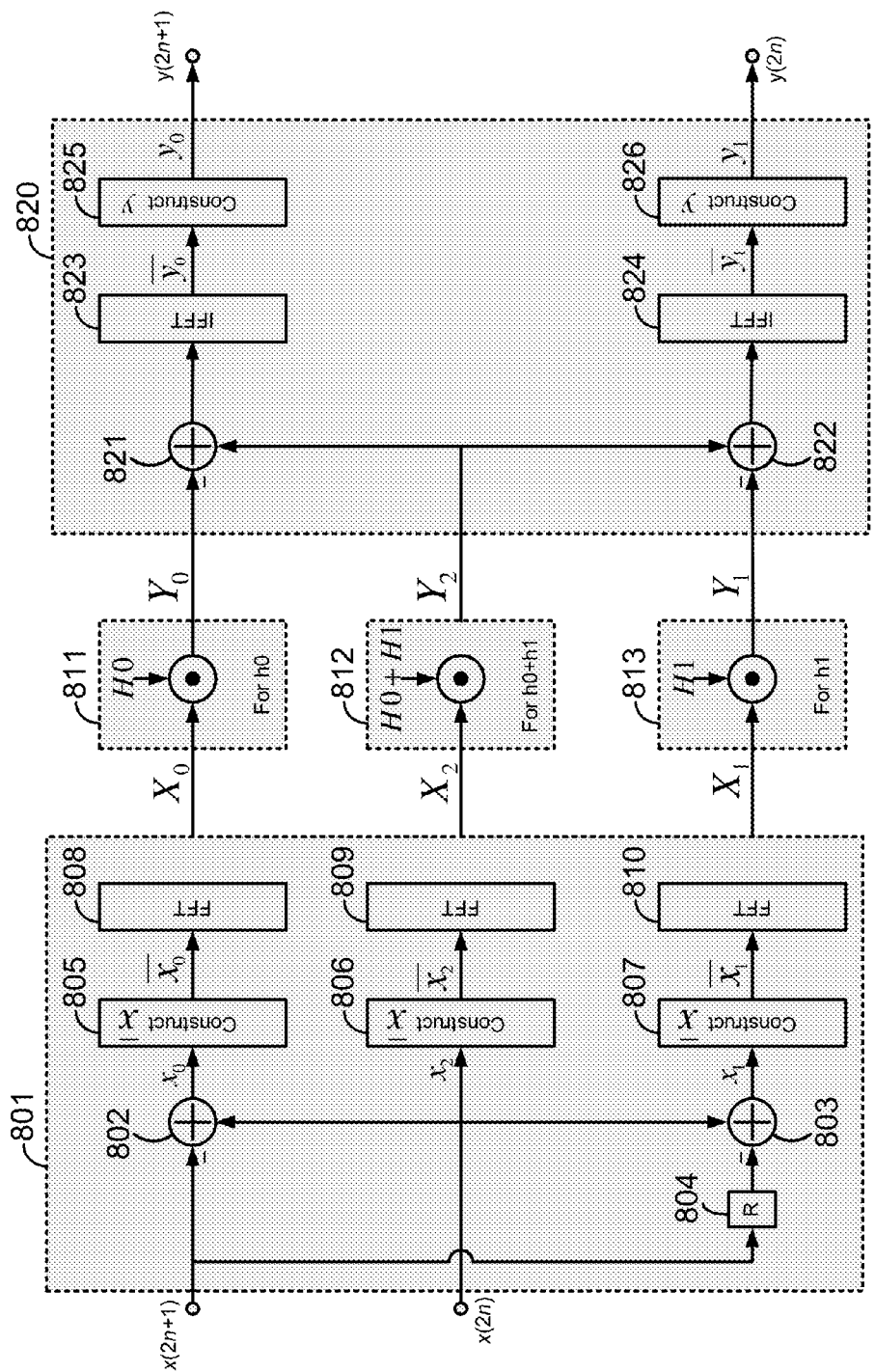
FIG. 8 is a schematic block diagram of an optimized version of the second embodiment of a hybrid digital filter.

In a second embodiment, the transform domain filtering is applied to at least one of the sub-filters of the time domain RCNP filter of FIG. 2b. FIG. 7, FIG. 7a, and FIG. 8 illustrate how, in a manner similar to generating the structure of FIG. 5, FIG. 5a, and FIG. 6, respectively, the transform domain filtering technique depicted in FIG. 3 is applied to the filters h0, h0+h1, and h1 of RCNP structure of FIG. 2b. The resulting structures in FIG. 7 and FIG. 7a benefit from both transform domain and time domain RCNP structures, but they can be further optimized by using the fact that the output transform (the IFFT in this example) is a linear operation. The resulting structure is depicted in FIG. 8. This means the output transforms (IFFT) 741 742 743 and the output constructors 744 745 746 in the hybrid post-processor 740 of FIG. 7a can be pushed towards the output to generate the output streams of the post-processor 740. The resulting optimized structure is depicted in FIG. 8. The adder/subtractor operations 821 822 producing the inputs to the output transforms (IFFT) 823 824 from the outputs of the H0 transform domain processor 811, H0+H1 transform domain processor 812, and H1 transform domain processor 813 operate in vector mode by performing element-by-element additions/subtractions. This optimization process eliminates 1 output transform block and 1 output constructor block and replaces the single element adder/subtractors 747 748 with element-by-element vector adder/subtractors 821 822. It should also be noted that the single element adder/subtractors run at the output stream rate, while the vector adder/subtractors operate at the vector update rate which is slower than the input stream rate, but includes addition/subtraction for each element of the vector. The example pre-processors 701 of FIG. 7, 721 of FIG. 7a, and 801 of FIG. 8 also include at least one delay element 704 724 and 804. The new hybrid filter structures depicted in FIGS. 7, 7a, and 8 differ from all prior art structures depicted in FIG. 1 through 4, by combining the RCNP and transform domain structures. The new hybrid filter structures are differentiated by prior art structures by including:

1. at least one linear operator within the pre-processor [702 703 within 701 in FIG. 7, 722 723 within 721 in FIG. 7a, and 802 803 within 801 in FIG. 8];
2. at least one transform domain processor [705 706 707 in FIG. 7, 731 732 733 in FIG. 7a, and 811 812 813 in FIG. 8];
3. at least one linear operator within the post-processor [709 710 within 708 in FIG. 7, 747 748 within 740 in FIG. 7a, and 821 822 within 820 in FIG. 8].

Figure 9:
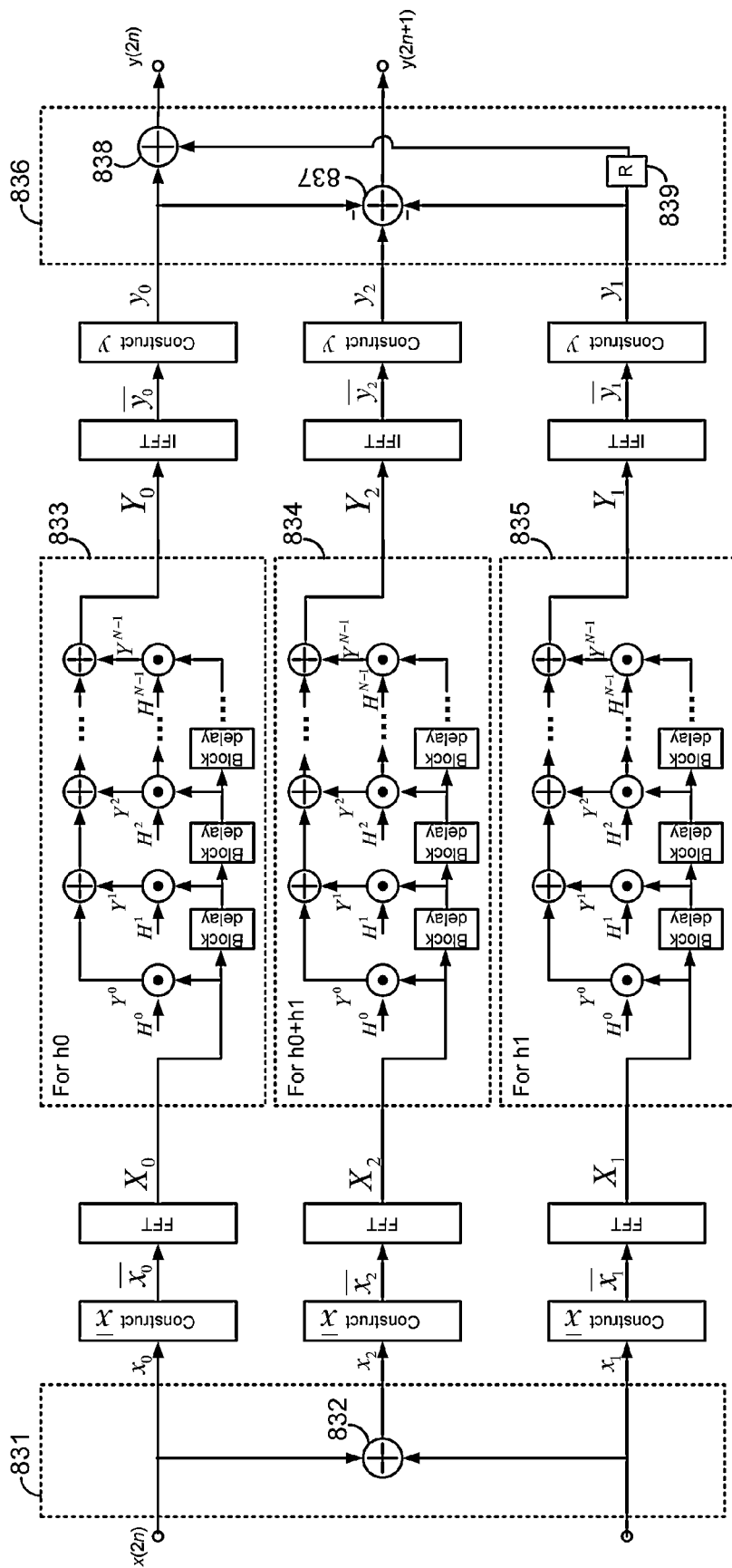
FIG. 9 is a schematic block diagram of a third embodiment of a hybrid digital filter.
Figure 9A:
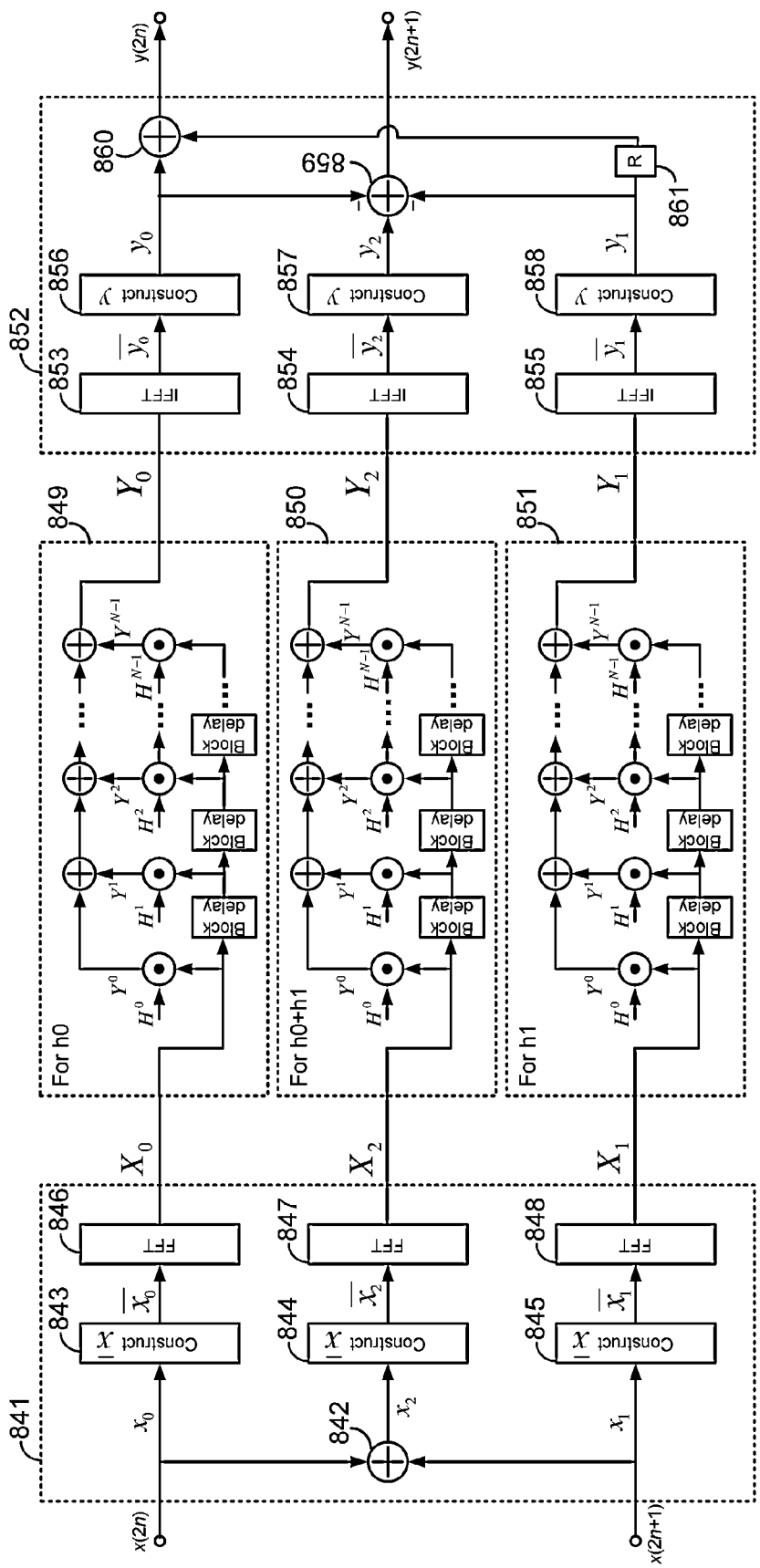
FIG. 9a is a schematic block diagram of a regrouped third embodiment of a hybrid digital filter.
Figure 10:
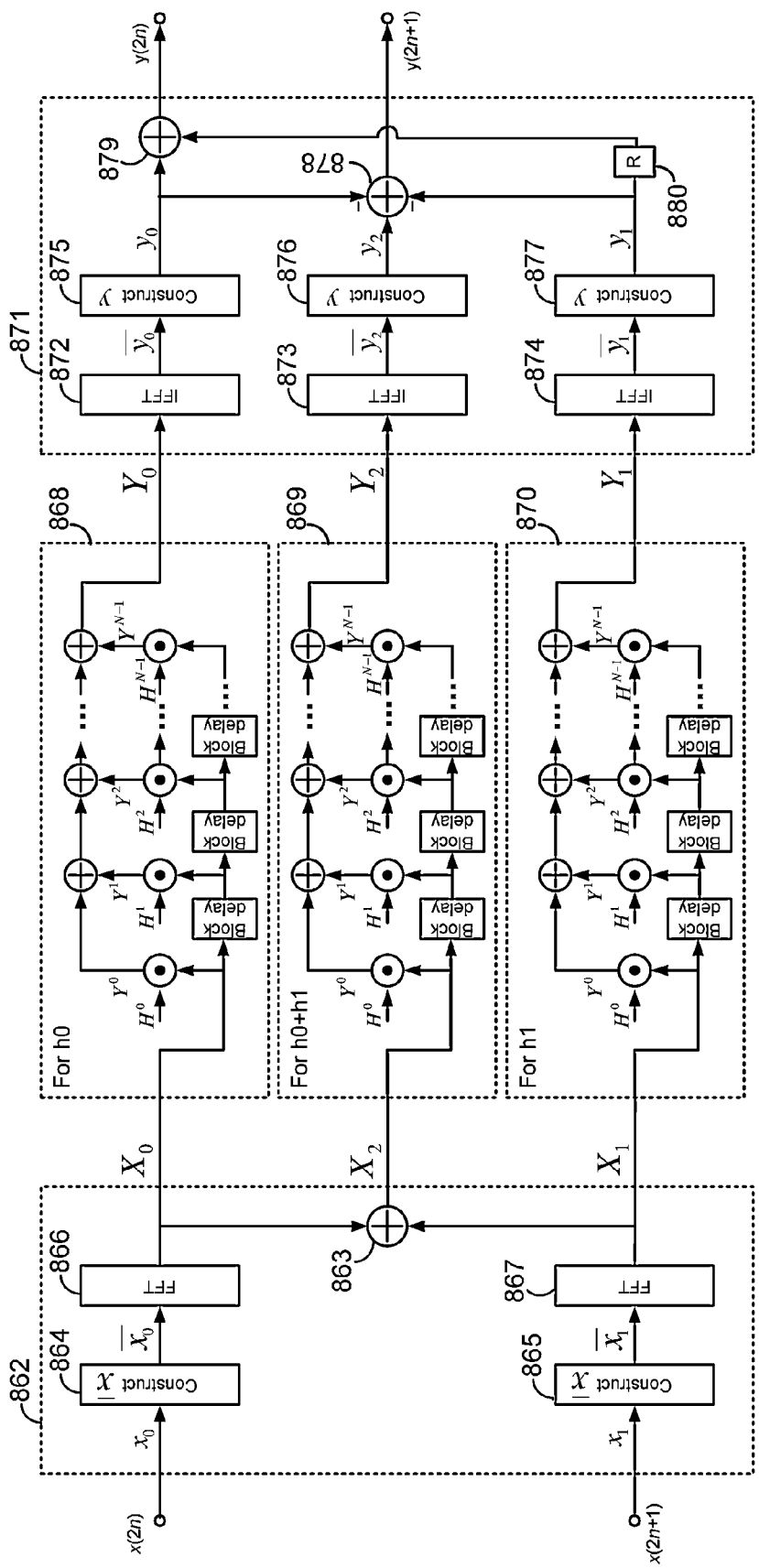
FIG. 10 is a schematic block diagram of an optimized version of the third embodiment of a hybrid digital filter.

In a third embodiment, the partitioned transform domain filtering, exemplified in FIG. 4e and FIG. 4f, is applied to at least one of the sub-filters of the time domain RCNP filter of FIG. 2a. The next set of hybrid structures are realized by applying the PTrD structure of FIG. 4e or FIG. 4f to any or all of the sub-filters of the RCNP structure of FIG. 2a. As an example, the result of applying the PTrD structure of FIG. 4e to all sub-filters of RCNP structure of FIG. 2a is illustrated in FIG. 9, FIG. 9a, and FIG. 10. The construction of FIG. 9 is similar to that of FIG. 5 with the exception that instead of using non-partitioned transform domain processors 503 504 505 in FIG. 5, partitioned transform domain processors 833 834 835 are used in FIG. 9. Similarly, the construction of FIG. 9a is similar to that of FIG. 5a with the exception that instead of using non-partitioned transform domain processors 529 530 531 in FIG. 5a, partitioned transform domain processors 849 850 851 are used in FIG. 9a. The structures of FIG. 9 and FIG. 9a can be optimized in a similar manner as FIG. 5 and FIG. 5a were optimized to get FIG. 6. Specifically, by using the fact that the input transform (the FFT in this example) is a linear operation, the input constructors and the FFT operations can be pushed towards the input to operate on the input streams. This eliminates 1 input transform and 1 input constructor. The result is the optimized structure of FIG. 10. The construction of FIG. 10 is similar to that of FIG. 6 with the exception that instead of non-partitioned transform domain processors 607 608 609, partitioned transform domain processors 868 869 870 are used in FIG. 10.

Figure 11:
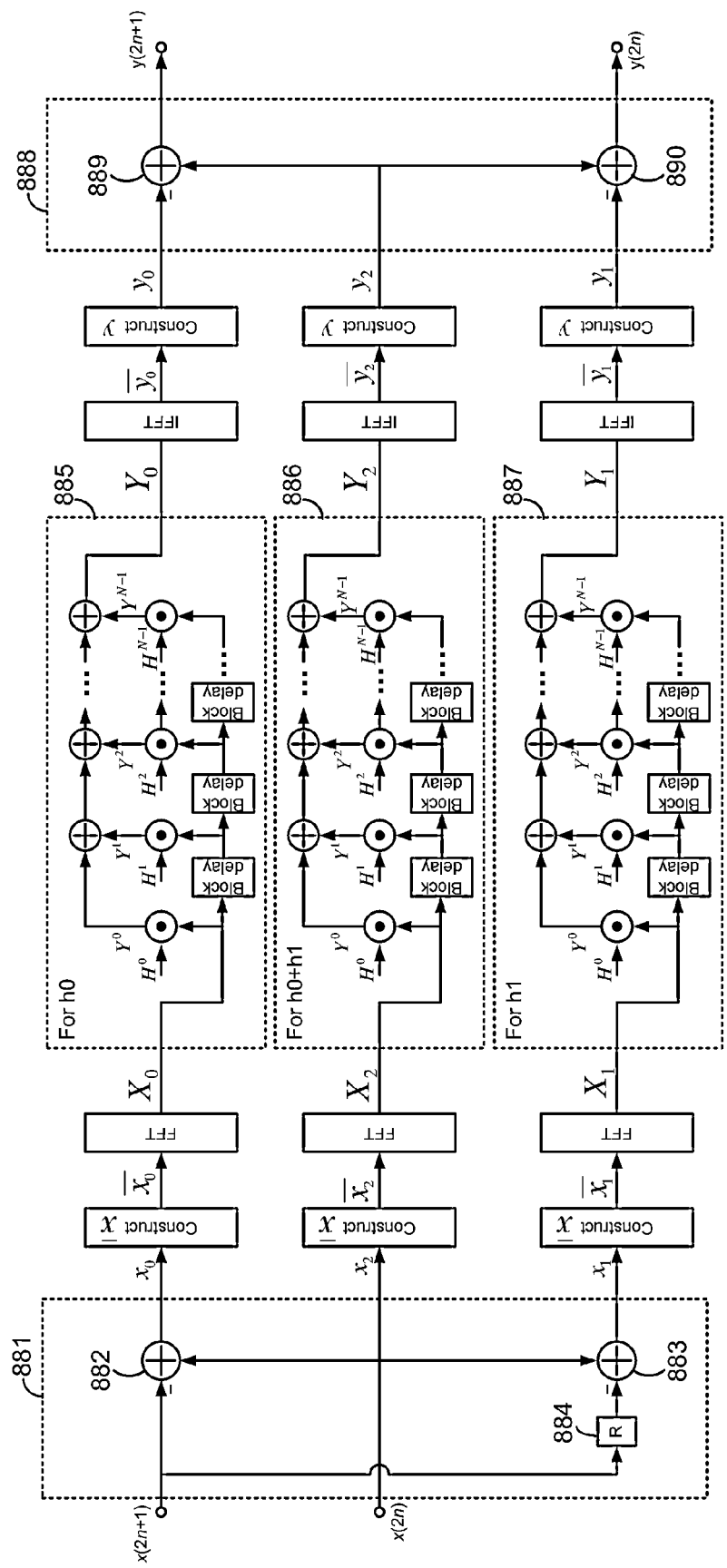
FIG. 11 is a schematic block diagram of a fourth embodiment of a hybrid digital filter.
Figure 11A:
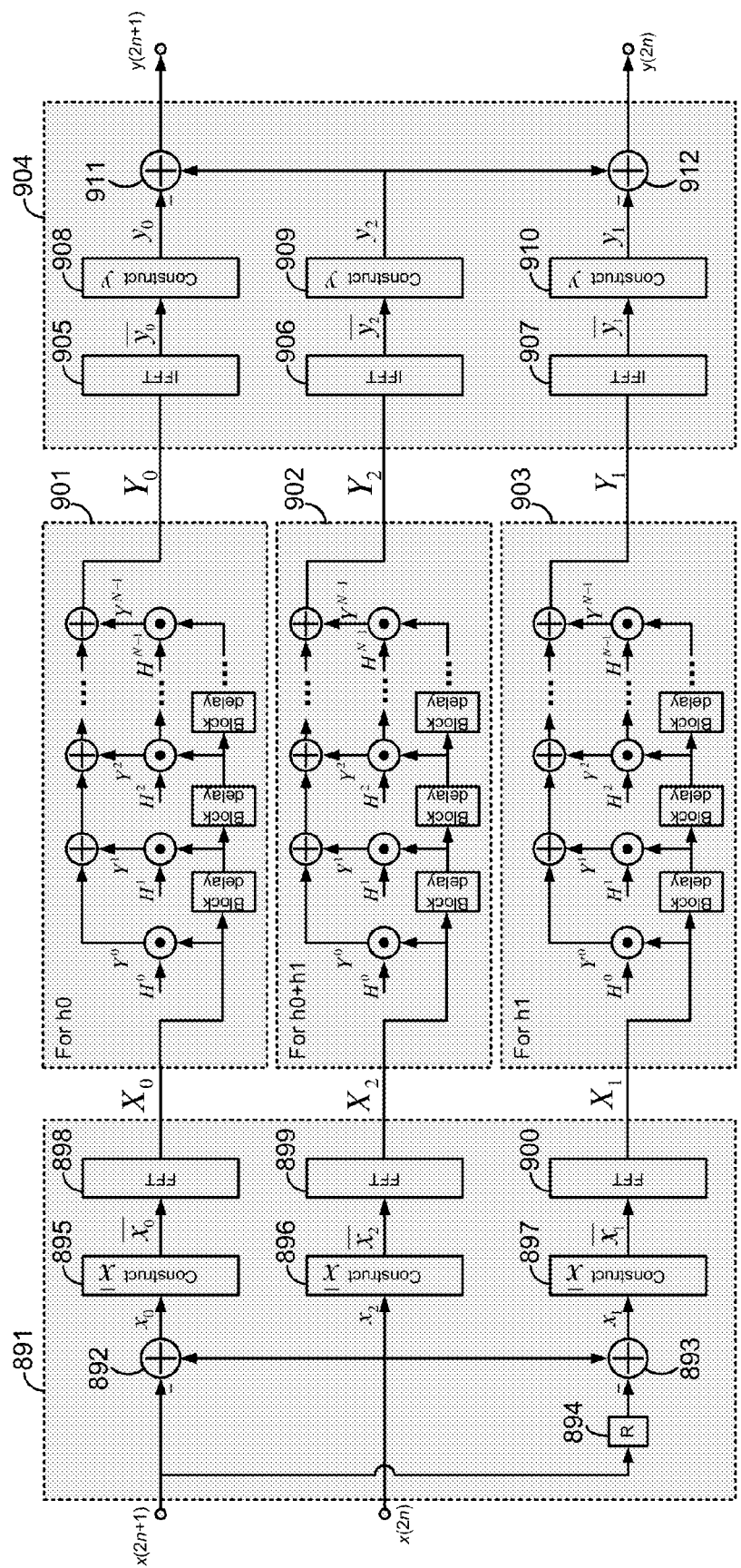
FIG. 11a is a schematic block diagram of a regrouped fourth embodiment of a hybrid digital filter.
Figure 12:
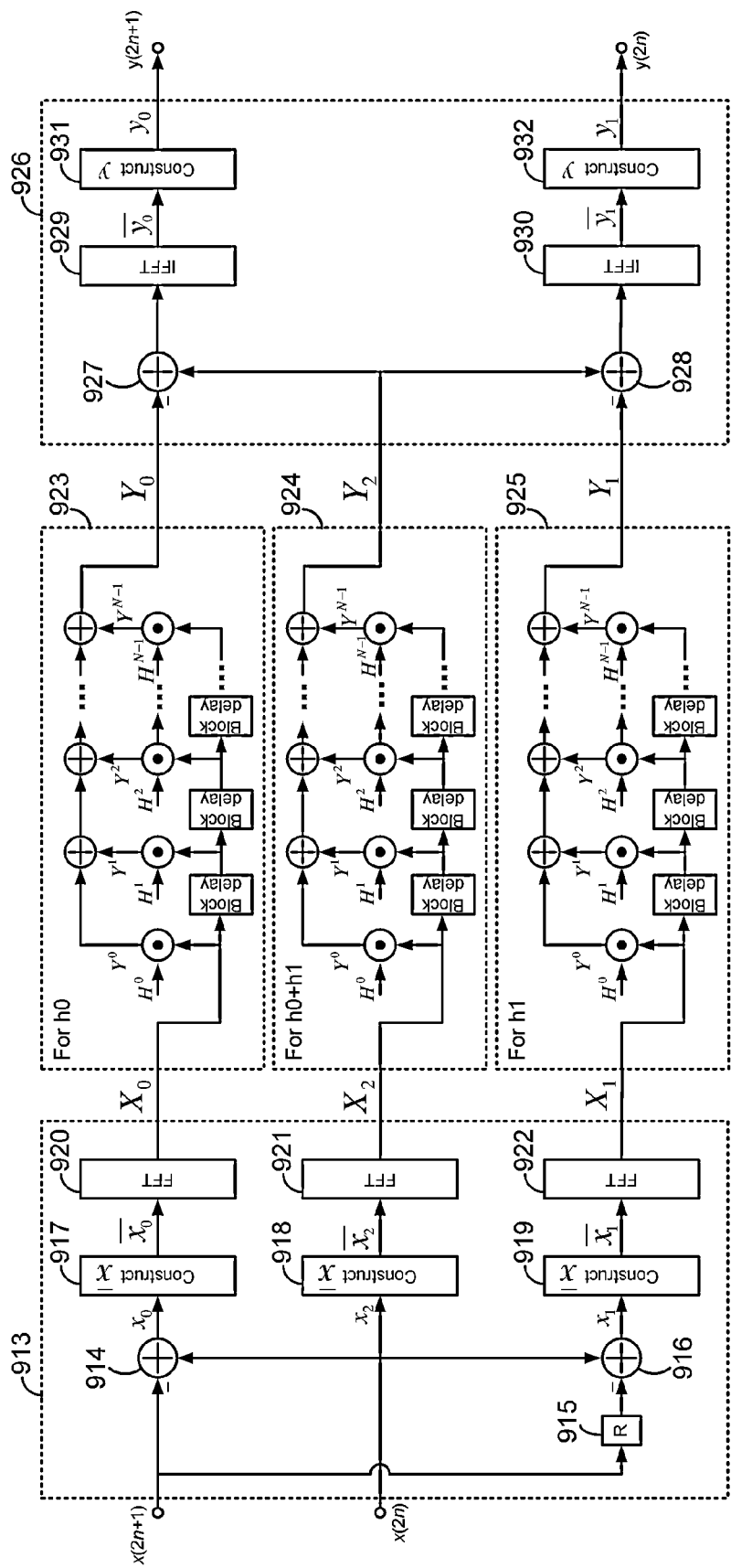
FIG. 12 is a schematic block diagram of an optimized version of the fourth embodiment of a hybrid digital filter.

In a fourth embodiment, the partitioned transform domain filtering, exemplified in FIG. 4e and FIG. 4f, is applied to at least one of the sub-filters of the time domain RCNP filter of FIG. 2b. The next set of hybrid structures are realized by applying the PTrD structure of FIG. 4e or FIG. 4f to any or all of the sub-filters of the RCNP structure of FIG. 2b. As an example, the result of applying the PTrD structure of FIG. 4e to all sub-filters of RCNP structure of FIG. 2b is illustrated in FIG. 11, FIG. 11a, and FIG. 12. The construction of FIG. 11 is similar to that of FIG. 7 with the exception that instead of using non-partitioned transform domain processors 705 706 707 in FIG. 7, partitioned transform domain processors 885 886 887 are used in FIG. 11. Similarly, the construction of FIG. 11a is similar to that of FIG. 7a with the exception that instead of using non-partitioned transform domain processors 731 732 733 in FIG. 7a, partitioned transform domain processors 901 902 903 are used in FIG. 11a. The structures of FIG. 11 and FIG. 11a can be optimized in a similar manner as FIG. 7 and FIG. 7a were optimized to get FIG. 8. Specifically, by using the fact that the output transform (the IFFT in this example) is a linear operation, the output transform (IFFT) and the output constructors can be pushed towards the output to generate the output streams of the post-processor. This process eliminates 1 output transform and 1 output constructor. The result is the optimized structure of FIG. 12. The construction of FIG. 12 is similar to that of FIG. 8 with the exception that instead of non-partitioned transform domain processors 811 812 813 in FIG. 8, partitioned transform domain processors 923 924 925 are used in FIG. 12.

All new hybrid structures exemplified in FIG. 9 through FIG. 12 differ from all prior art structures depicted in FIG. 1 through 4, by combining the RCNP and partitioned transform domain structures. The new hybrid filter structures are differentiated by prior art structures by including:

1. at least one linear operator within the pre-processor [832 within 831 in FIG. 9, 842 within 841 in FIG. 9a, 863 within 862 in FIG. 10, 883 882 within 881 in FIG. 11, 892 893 within 891 in FIG. 11a, 914 916 within 913 in FIG. 12];
2. at least one transform domain processor [833 834 835 in FIG. 9, 849 850 851 in FIG. 9a, 868 869 870 in FIG. 10, 885 886 887 in FIG. 11, 901 902 903 in FIG. 11a, and 923 924 925 in FIG. 12];
3. at least one linear operator within the post-processor [837 838 within 836 in FIG. 9, 859 860 within 852 in FIG. 9a, 878 879 within 871 in FIG. 10, 889 890 within 888 in FIG. 11, 911 912 within 904 in FIG. 11a, and 927 928 within 926 in FIG. 12].

The hybrid pre-processors 601 in FIGS. 6 and 862 in FIG. 10 have been optimized by having the input constructors 603 604 and input transforms 605 606 prior to the linear operator 602 in FIG. 6, and input constructors 864 865 and input transforms 866 867 prior to the linear operator 863 in FIG. 10.

The hybrid post-processors 820 in FIGS. 8 and 926 in FIG. 12 have been optimized by having the output transforms 823 824 and output constructors 825 826 follow the linear operators 821 822 in FIG. 8, and output transforms 929 930 and output constructors 931 932 follow the linear operators 927 928 in FIG. 12.

Single Input Multiple Output Hybrid Filters

Figure 13:
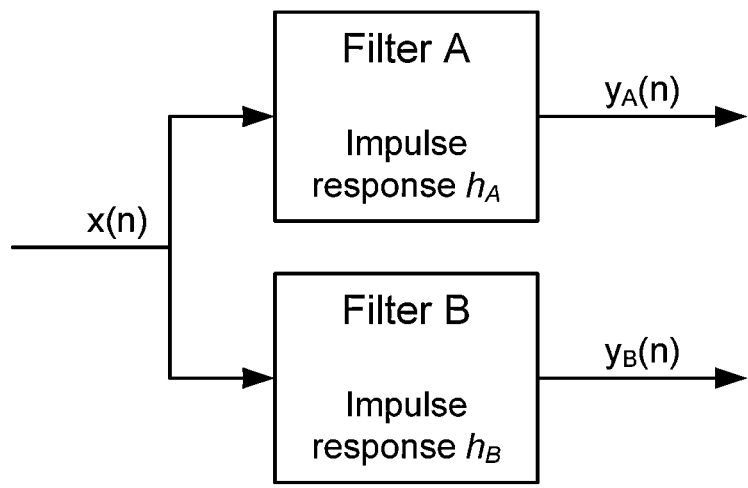
FIG. 13 is a schematic block diagram of a general filter with a single input and multiple outputs.

Now we consider situations when the filter input stream needs to get filtered by plurality of filters, and as a result generating plurality of outputs. We will refer to the number of outputs as O. FIG. 13 illustrates the setup for an example where 2 filters (O=2) are operating on the input signal to produce 2 output signals. Again, it should be noted that O=2 is used for illustration purposes within this embodiment.

For such single input, multiple output structures, we note that whatever processing is done on the input that is independent of the operations that are specific to the filter's impulse responses $h_A$ and $h_B$, these operations can be performed once and the results can be used for implementing both filters. We will refer to this technique as the common input processing technique. For example in the RCNP structures of FIGS. 2a and 2b, the pre-processing 210 and 240 of the input stream can be done once then the outputs of the pre-processing can be further processed by the structures corresponding to each sub-filter. Similarly, in the transform domain structure depicted in FIG. 3, the input constructor 310 and input transform 320 (FFT in this example) operations can be done with a common block then the result can get further processed with blocks (element-be-element multiplication, IFFT output transform, and output constructor) with blocks that are specific to filter A and filter B. The same idea can be applied to the PTiD structure of FIG. 4b (where the input delay elements are common). In FIG. 4c and FIG. 4e the common input processing blocks can be the input stream to block constructor 401 421, the input transform 402 422, and in the case of partitioned transform domain processor using block delays at the input as in FIGS. 4c and 4e, the block delays 403 404 405 in FIGS. 4c and 423 424 in FIG. 4e can also be common processing blocks. In FIG. 4d and FIG. 4f the common input processing blocks can be the input stream to block constructor 441 461, and the input transform 442 462.

We may apply the common input processing technique to single input multiple output filters utilizing any of the described hybrid filter families, some of which are exemplified in FIG. 5 through FIG. 12. We note in particular that in cases where single input is filtered with multiple filters to generate multiple outputs, the application of this technique to the hybrid filter family based on the RCNP structures of type exemplified in FIG. 2b, where the post processor is free of any delay elements, yields benefits from having common blocks to process the input AND also benefits from the output transform (IFFT) and output constructor reduction at the outputs of all the filters. We again highlight that the applications of all these techniques are not restricted to any size of the filter or any parameter, rather they apply in general to the families of the discussed filter families and structures. Furthermore, the filter sizes for filter A and filter B need not have any relation or dependencies. The technique can be generalized to any size filters. Also, the choices for applying the NON-partitioned transform domain TrD structure of FIG. 3, or "partitioned-type" PTrD structure exemplified by FIG. 4e and FIG. 4f to each filter A and B can be independent of each other. In other words one may apply non-partitioned TrD structure to one filter and a PTrD structure to another filter. This may especially be useful when lengths of filters A and B are different, but is applicable in the most general case. Furthermore, the number of partitions (N in FIG. 4e and FIG. 4f) chosen for each filter can also be arbitrary. It should be noted that for the effective application of common input processing technique one may choose the partitioning among the filters to yield a common size transform. If various size transforms are required, the common input processing technique can be applied to groups of filters that use a common size transform. For example, in situations where the input is processed with more than two filters, it is possible that there will be a group of filters sharing the same size transform, but there are a plurality of such groups. The choice of non-partitioned or partitioned based structure, the partitioned based structure with block delays at the input (similar to FIG. 4e) or towards the output (similar to FIG. 4f) and amount of partitioning N may also be different for the sub-filters within each filter A or B. It is also important to note that in the case of choosing partitioned transform domain processor with block delays at the input (434 in FIG. 4e) the block delays can be part of the common input processing and be shared among all sub-filters using these delays. In the case of filter or sub-filter transform domain processor using block delays of various sizes, they may be accommodated by utilizing common delays that provide the proper amount of delay to each section. All these configurations and variations are possible and are within the scope of the present invention.

Figure 14:
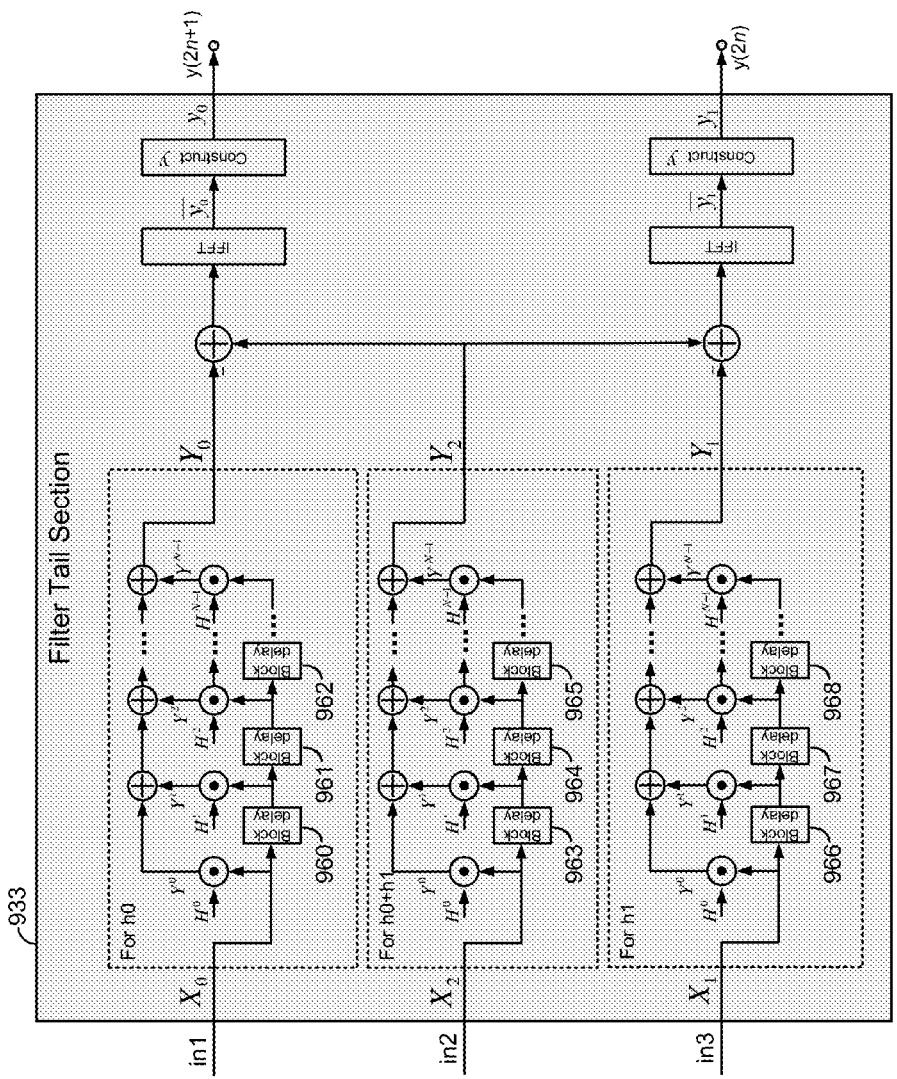
FIG. 14 is a schematic block diagram of the tail block of FIG. 12.
Figure 15:
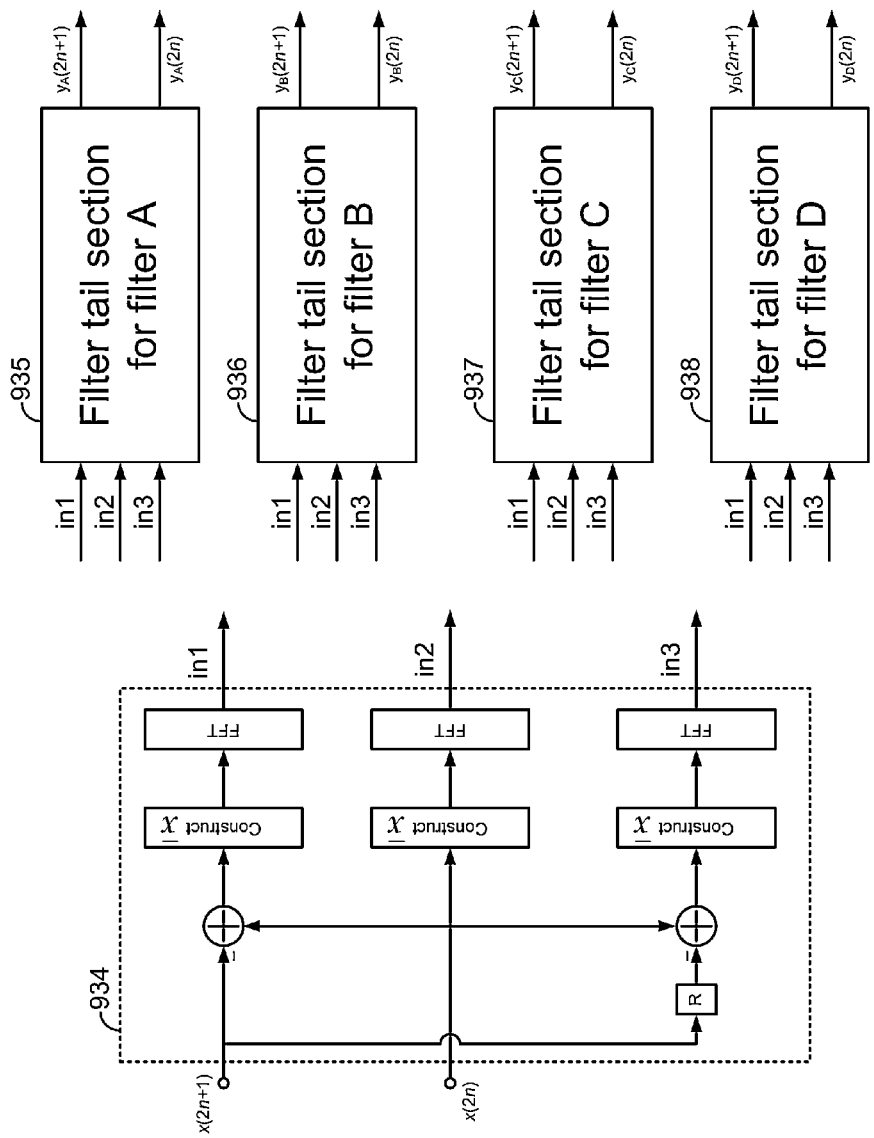
FIG. 15 is a schematic block diagram of an embodiment of a hybrid digital filter with a single input and multiple outputs.

To further illustrate the application of common input processing technique to the hybrid filter family based on the RCNP structures of type exemplified in FIG. 2b, we use the structure of FIG. 12, which utilizes partitioned frequency domain processors with block delays at the input. To ease the illustration, we use the filter tail block 933 depicted in FIG. 14, which is comprised of the transform domain processors 923 924 925 of FIG. 12 and the post-processor 926 of FIG. 12. FIG. 15 illustrates the application of the common input processing technique based on the hybrid filter structure of FIG. 12 when an input is being filtered by 4 filters A, B, C, and D. In FIG. 15 the common input processor 934 is the pre-processor 913 of FIG. 12. The common input processor 934 generates the outputs "in1", "in2", "in3" which feed the inputs of each filter tail section 935 936 937 938 corresponding to filters A, B, C, and D. Each of the filter tail structures 935 936 937 938 may have the structure 933 depicted in FIG. 14. In FIG. 15 one may see how the common input processor 934 is shared for the generation of all output corresponding to filters A, B, C, and D. The resulting structure depicted by FIGS. 14 and 15, utilizes 3 input transforms (FFT) and 3 input constructors in the common input processor and output transforms (IFFT) and 8 output constructors (2 output transforms and 2 output constructors per output for filters A, B, C, and D). For this example of an input being processed by 4 filters A, B, C, and D, if the technique of common input processing is instead applied to a structure like that of FIG. 10 (i.e., a structure based on an RCNP family using a pre-processor free of any delay elements), then the resulting structure would require 2 input transforms (FFT) and 2 input constructors in the common input processor and 12 output transforms (IFFT) and 12 output constructors (3 output transforms and 3 output constructors per output for filters A, B, C, and D). We noted earlier that any type of transform domain processor may be used (non-partitioned 330, partitioned 413 453 434 473, partitioned with block delays at the input 413 434, partitioned with block delays towards the output 453 473), but in the case of partitioned transform domain processor with block delays at the input, which is what FIG. 14 and FIG. 15 illustrate, one may see that the block delays 960 961 962 for "in1" can be pulled out of the filter tail sections 935 936 937 938 and only one instance of them placed in the common input processor 934 which enables sharing them across all filter tail sections for A, B, C, and D. Similarly, block delays 963 964 965 for "in2" and 966 967 978 for "in3" can be pulled out of the filter tail sections 935 936 937 938 and only one instance of them placed in the common input processor 934 which enables sharing them across all filter tail sections for A, B, C, and D. One should always consider all possibilities and make a selection that is most desirable.

Multiple Input Single Output Hybrid Filters

Now we consider cases where multiple possibly independent input streams are processed by multiple possible independent filters and the results are combined via linear operations (e.g., addition, subtraction) to generate a single output. We will refer to the number of independent input streams as I. In such cases, the output combining linear operation can be pushed into the structure. Once the output combining linear operation is pushed into the structure, the blocks that are not dependent on the filters' impulse responses that are processing the outputs of each one of the I filters can also be shared.

Figure 16:
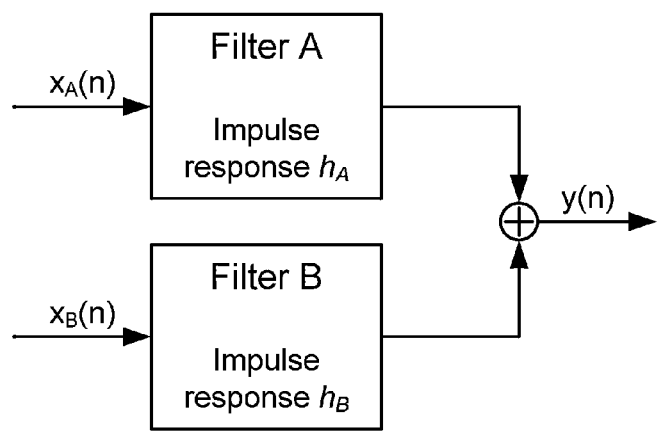
FIG. 16 is a schematic block diagram of a general filter with multiple inputs and a single output.

FIG. 16 illustrates the setup for an example where I=2 input streams are being filtered by 2 filters and the outputs of the filters are being combined by an addition as the linear operation to generate the output. Again, it should be noted that I=2 is used for illustration purposes and the methods can be used for choices other than 2. Also, the linear operation is chosen to be addition for illustration purposes and the methods can be used for any linear operation.

For such multiple input, single output structures, we note whatever post-filter-dependent processing is done to generate the outputs of the filters A and B, then these outputs being combined via the linear operation, these processes can be interchanged to create a structure where the corresponding streams generated by the different filter-dependent sections are combined first and then these combined streams are processes by one non-filter dependent processing to generate the combined output. We will refer to this technique of interchanging the linear output combining with the non-filter-impulse-response-dependent processing at the outputs and performing the non-filter-impulse-response-depend operations only once on the combined signal as the common output processing technique. The common output processing technique has the same aim of sharing as many processing blocks for the generation of the output(s) just as the common input processing technique aims to share as many processing blocks used to process the input(s).

For example, in the RCNP structures of FIGS. 2a and 2b, the post-processing of the streams generated by the filter A sub-filters can be done once after these streams have been combined with their corresponding streams resulting from the sub-filters processing the other input(s) (in the 2 input example the sub-filters corresponding to filter B). Similarly, in the transform domain structure depicted in FIG. 3, the output transform 340 (IFFT in this example) and output block to stream constructor 350 can be done with a common block once the outputs of the transform domain processor 330 corresponding to the filters A and B processing the different inputs have been combined via the same linear operation (addition for the FIG. 16 example). Same idea can be applied to the PTiD structure of FIG. 4b (where the adders following the sub-filters can be applied after combining sub-filter outputs corresponding to the different inputs). In PTrD structures of FIGS. 4c, 4d, 4e, and 4f the common output processing (after combining of corresponding signals) may constitute the output transform 414 454 432 474, output constructor 415 455 433 475. Furthermore, from transform domain processors with block delays at the input, such as in FIGS. 4c and 4e, the block adders 410 411 412 can also be pulled out of the transform domain processor 413, and the block adders 429 430 431 can be pulled out of the transform domain processor 434, and be shared in the common output processor. Similarly, from transform domain processors with block delays towards the output, such as in FIGS. 4d and 4f, the block adders 450 451 452 and the block delays 447 448 449 can also be pulled out of the transform domain processor 453, and the block adders 470 471 472 and the block delays 467 468 469 can be pulled out of the transform domain processor 473, and be shared in the common output processor.

One may apply the common output processing technique to multiple input single output filters utilizing any of the described hybrid filter families, some of which are exemplified in FIG. 5 through FIG. 12. We note in particular the case of multiple input single output filter, the application of common output technique to the hybrid filter family based on the RCNP structures of type exemplified in FIG. 2a where the pre-processor is free of delay elements, yields benefits from having common blocks to produce the output AND also benefits from the input transform (FFT) and input constructor reduction at the inputs of all the filters. We again highlight that the applications of all these techniques are not restricted to any size of the filter or any parameter, rather they apply in general to the families of the discussed filter families and structures. Furthermore, the filter sizes for the filters (A, B, . . . ) processing the various inputs need not have any relation or dependencies. The technique can be generalized to any size filters. Also, the choices for applying the NON-partitioned transform domain TrD structure of FIG. 3, or "partitioned-type" PTrD structure exemplified by FIG. 4e and FIG. 4f to each filter (A,B, . . . ) can be independent of each other. In other words one may apply non-partitioned TrD structure to one filter and a PTrD structure to another filter. This may especially be useful when lengths of various filters (A,B, . . . ) are different, but is applicable in the most general case. Furthermore, the number of partitions (N in FIG. 4e and FIG. 4f) chosen for each filter can also be arbitrary. It should be noted that for the effective application of common output processing technique one may choose the partitioning among the filters to yield a common size transform. If various size transforms are required, the common output processing technique can be applied to groups of filters that use a common size transform. For example, in situations where there are more than two inputs with each input being filtered with it's own filter, it is possible that there will be a group of filters sharing the same size transform, but there are a plurality of such groups. The choice of non-partitioned or partitioned based structure, the partitioned based structure with block delays at the input (similar to FIG. 4e) or towards the output (similar to FIG. 4f) and amount of partitioning N may also be different for the sub-filters within each filter (A,B, . . . ). It is also important to note that in the case of choosing partitioned transform domain processor with block delays at the input (434 in FIG. 4e) the block adders can be part of the common output processing and be shared among all sub-filters after combining the corresponding streams according to the linear operation combining the filter (A,B, . . . ) outputs. In the case of choosing partitioned transform domain processor with block delays towards the output (473 in FIG. 4f) the block adders and block delays can be part of the common output processing and be shared among all sub-filters after combining the corresponding streams according to the linear operation combining the filter (A,B, . . . ) outputs. All these configurations and variations are possible and are within the scope of the present invention.

Figure 17:
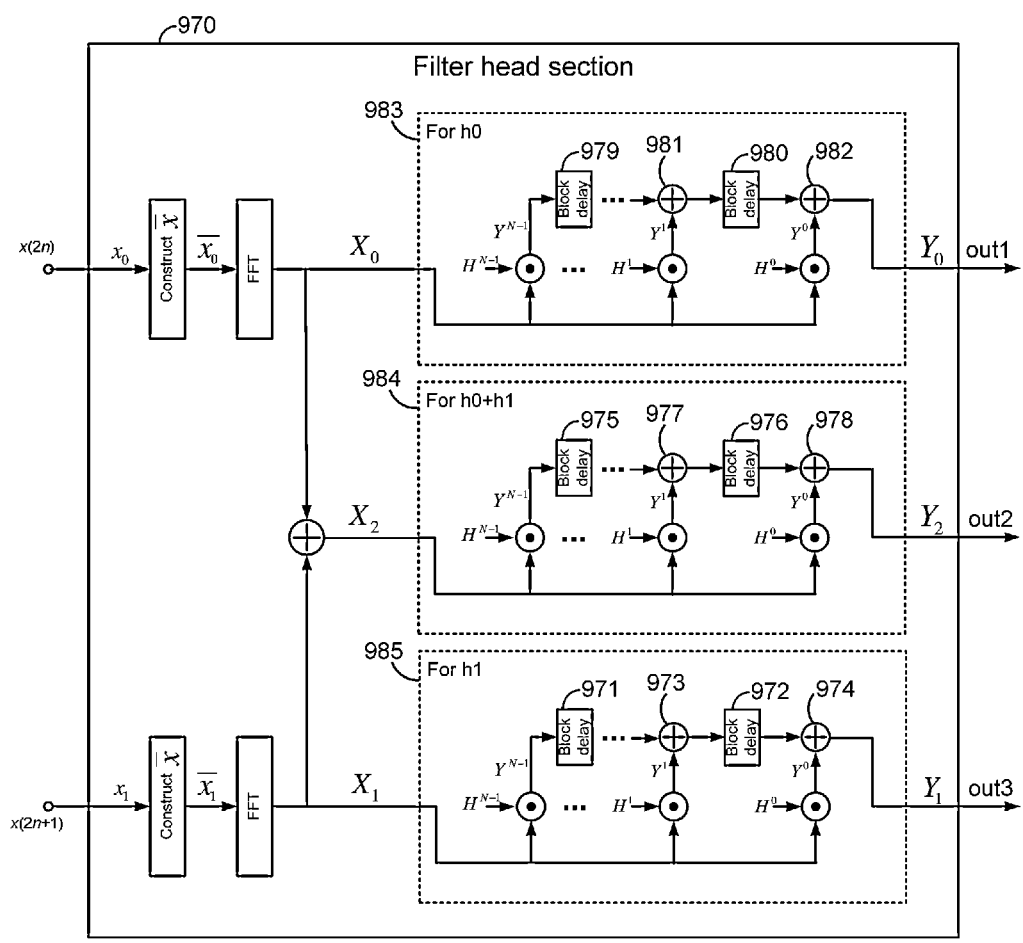
FIG. 17 is a schematic block diagram of the head block of FIG. 10 with transposed transform domain partitioned processors.
Figure 18:
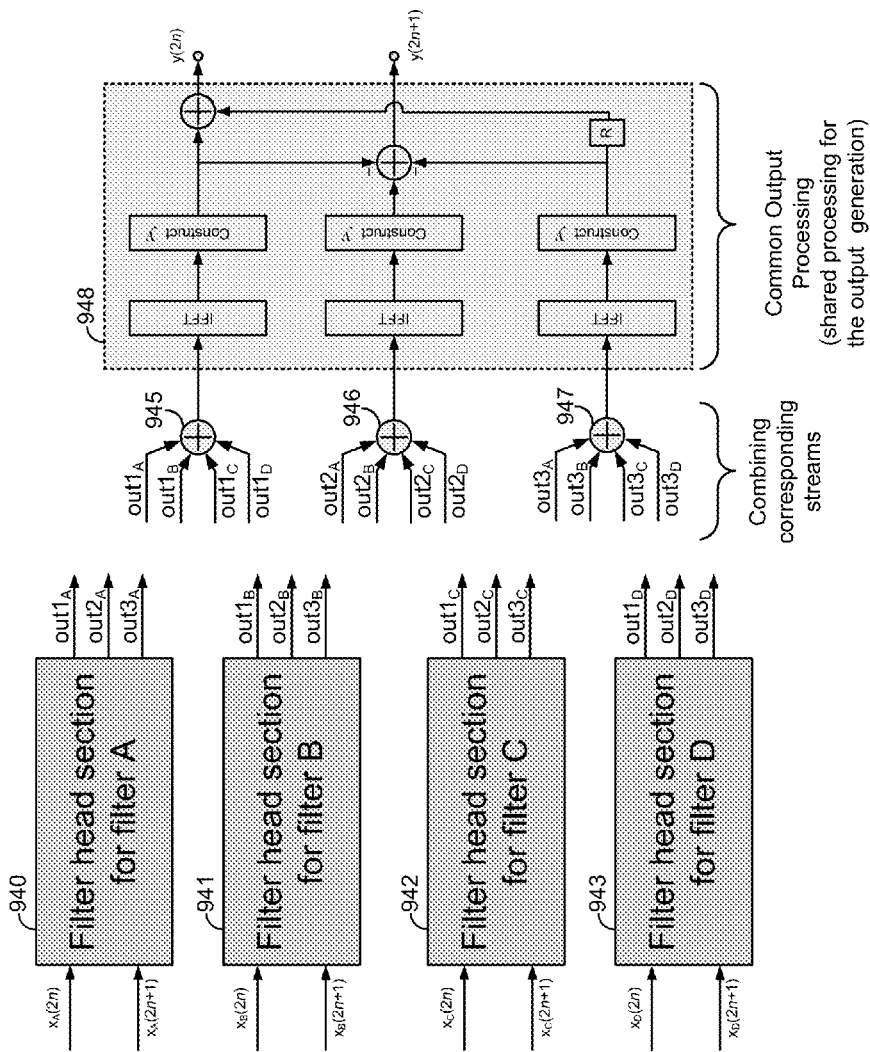
FIG. 18 is a schematic block diagram of an embodiment of a hybrid digital filter with multiple inputs and a single output.

To further illustrate the application of common output processing technique we use an exemplary structure having 4 inputs that are filtered with their corresponding filters A, B, C, and D, and the filter outputs are added to yield the single output. Our example will use a hybrid structure based on the RCNP structures of type exemplified in FIG. 2a, where the pre-processor is free of any delay elements, and it will utilizes partitioned frequency domain processors with block delays towards the output. To ease the illustration, we use the filter head block 970 depicted in FIG. 17, which is comprised of the transform domain processors 983 984 985 and the pre-processor 862 of FIG. 10. For illustration purposes, the transform domain processors 983 984 985 in FIG. 17 differ from the transform domain processors 868 869 870 in FIG. 10 by having the block delays towards the output instead of the input. FIG. 18 illustrates the application of the common output processing technique when 4 inputs are filtered by filters A, B, C, and D, and the filtered outputs are added to generate the output. FIG. 18 utilizes the filter head sections 940 941 942 943, each of which may be the filter head section 970 of FIG. 17. The filter head sections 940 941 942 943 in FIG. 18 each generate three signals "out1", "out2", "out3" with their corresponding subscripts A, B, C, D which get combined with their corresponding signals from the filter head sections for filters A, B, C, D. The combining of these signals is done using the same linear operations that combine the filtered signals in the original structure to produce the output. In this example the 4 filter outputs were added, hence the combining of the corresponding streams is done using the adders 945 946 947 in FIG. 18. Once the streams are combined then the common output processor 948 generates the output. In FIG. 18 one may see the common output processor 948 consolidates the processing, in this case the post-processor operations, from all the A, B, C, and D streams into a common (i.e., shared) operation. The resulting structure depicted by FIGS. 17 and 18 utilizes 8 input transforms (FFT) and 8 input constructors (2 input transforms and 2 input constructors per filter head section for filters A, B, C, and D) and 3 output transforms (IFFT) and 3 output constructors in the common output processor. For this example, if the technique of common output processing is instead applied to a structure like that of FIG. 12 (i.e., a structure based on an RCNP family using a post-processor free of any delay elements), then the resulting structure would require 12 input transforms (FFT) and 12 input constructors (3 input transforms and 3 input constructors per filter head section for filters A, B, C, and D) and 2 output transforms (IFFT) and 2 output constructors in the common output processor. We noted earlier that any type of transform domain processor may be used (non-partitioned 330, partitioned 413 453 434 473, partitioned with block delays at the input 413 434, partitioned with block delays towards the output 453 473), but in the case of partitioned transform domain processor with block delays towards the output, which is what FIG. 17 and FIG. 18 illustrate, one may see that the block delays 979 980 and block adders 981 982 for "out1", similarly the block delays 975 976 and block adders 977 978 for "out2", similarly the block delays 971 972 and block adders 973 974 for "out3" can be pulled out of the filter head sections 940 941 942 943 and only one instance of them placed in the common output processor 948 which enables utilizing one set for the processing required from all filters A, B, C, and D. This reduces the total number of block delays and block adders by a factor of 4 in this example. To facilitate such reduction though, the linear combining may have to be modified. In this example the linear combining depicted by 945 946 947 need to combine the signals $Y^0, \ldots Y^{N-1}$ across all corresponding streams in the filter head sections of filters A, B, C, and D. In this example one will need to linearly combine the four $Y^0$ signals in the transform domain processors 983 "For h0" across the 4 filter head sections for A, B, C, and D. Similar combining is necessary for the remaining $Y^1 \ldots Y^{N-1}$ signals in 983 and all the $Y^0 \ldots Y^{N-1}$ signals in the remaining transform domain processors 984 985. It should be noted that if instead partitioned transform domain processors with block delays at the input were used, one would not be able to push the input block delays (for example 423 424 in FIG. 4e) into the common output processor but one would be able to push the block adders (for example 429 430 431 in FIG. 4e) into the common output processor. Careful evaluation of all these options and considerations of potential improvements from reductions obtained by pushing blocks into the common output processor and potential increases due to common stream combining should be thoroughly evaluated to lead to the most desirable selection.

Multiple Input Multiple Output Hybrid Filters

Any of the techniques described for the "multiple-input single-output" and "single-input multiple-output" cases can used to generate efficient hybrid structures for multiple-input multiple-output cases. In multiple-input multiple-output cases, the structure has multiple inputs where each input may be filtered by multiple filters, then outputs from multiple filters may be combined via linear operations to generate one of the multiple outputs of the structure.

One such example is found in 10 Gigabit Ethernet (10GBaseT) transceivers. The 10GBaseT transceiver example is used as an example for illustration purposes. The techniques described here are more general and can be applied to any multiple-input multiple-output system. Consider the example structure (4-input 4-outputs in this example) depicted in FIG. 19.

Figure 19:
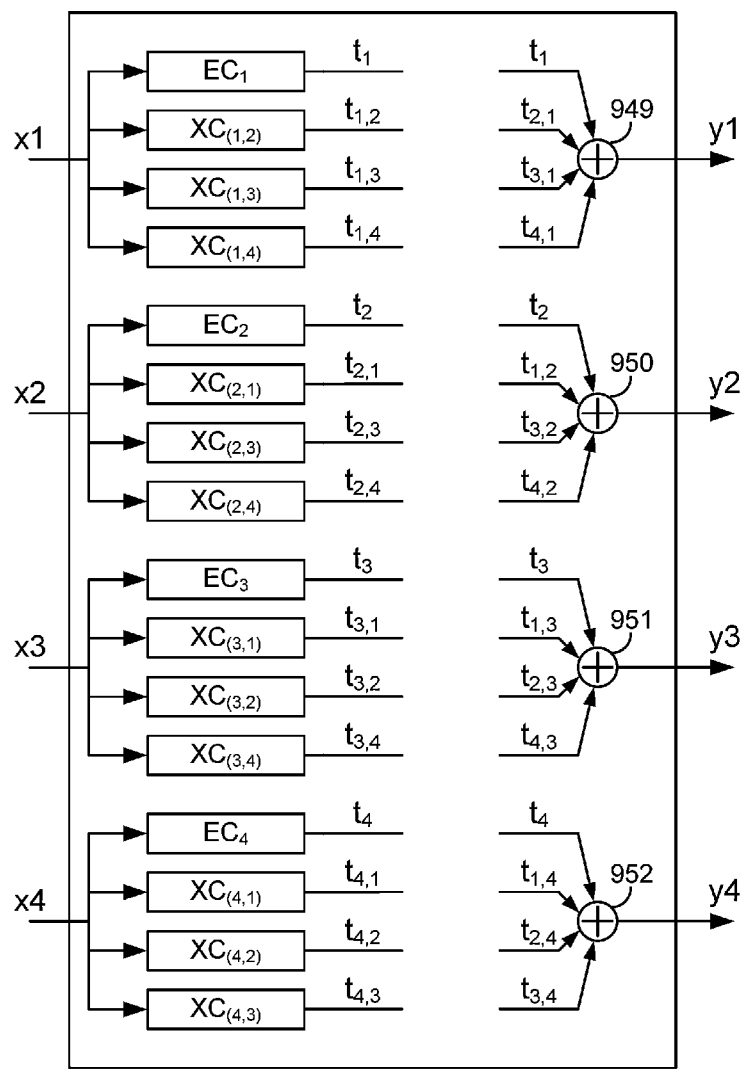
FIG. 19 is a schematic block diagram of an example of a filter with multiple inputs and multiple outputs.

In the example structure of FIG. 19 the filters $EC_i$ denote Echo Cancelling filters for the i-th input, and $XC_{(i,j)}$ denotes a Crosstalk Canceller between the i-th input and j-th output. The signals $t_i$ and $t_{(i,j)}$ denote the signals at the output of the EC and XC filters, where all $t_j$ and $t_{(i,j)}$ are linearly combined (via the addition in this example) to generate the j-th output $y_j$. It should be noted that the number of inputs and number of outputs need not be the same number and the techniques described here are general and apply to any number of input and any number of output structures. One can readily notice in FIG. 19 that the part of the structure that processes the i-th input and generates the corresponding $t_i$ and $t_{(i,j)}$ resembles the single-input multiple-output structure of FIG. 13 but extended to the 4-output case, while considering only the blocks and signals necessary to generate the j-th output we obtain the multiple-input single-output structure of FIG. 16 but extended to the 4-input case. Therefore, in multiple-input multiple output structures one may apply the techniques for both single-input multiple-output and multiple-input single-output cases.

Figure 20:
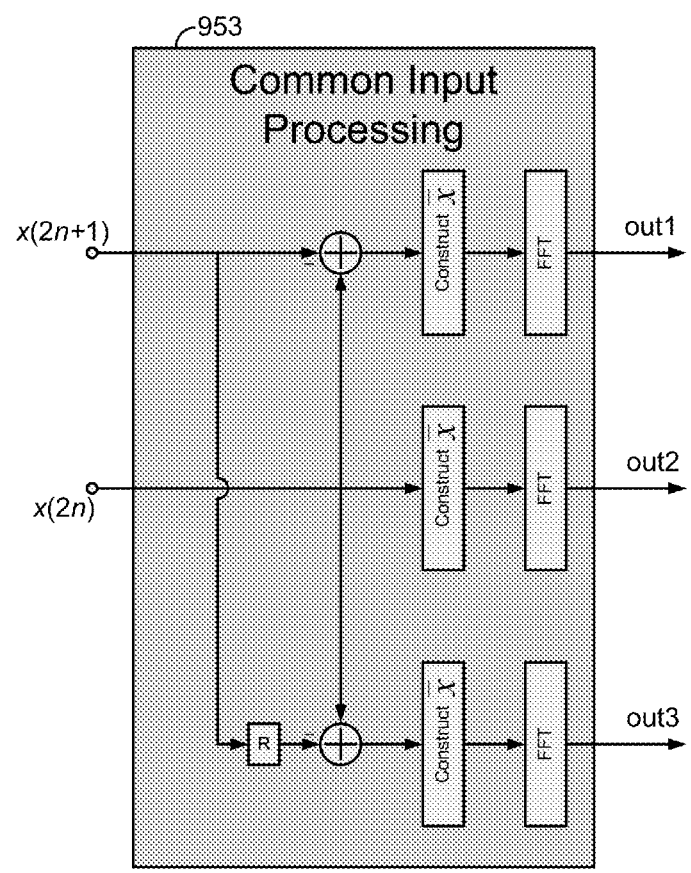
FIG. 20 is a schematic block diagram of an input processing block.
Figure 21:
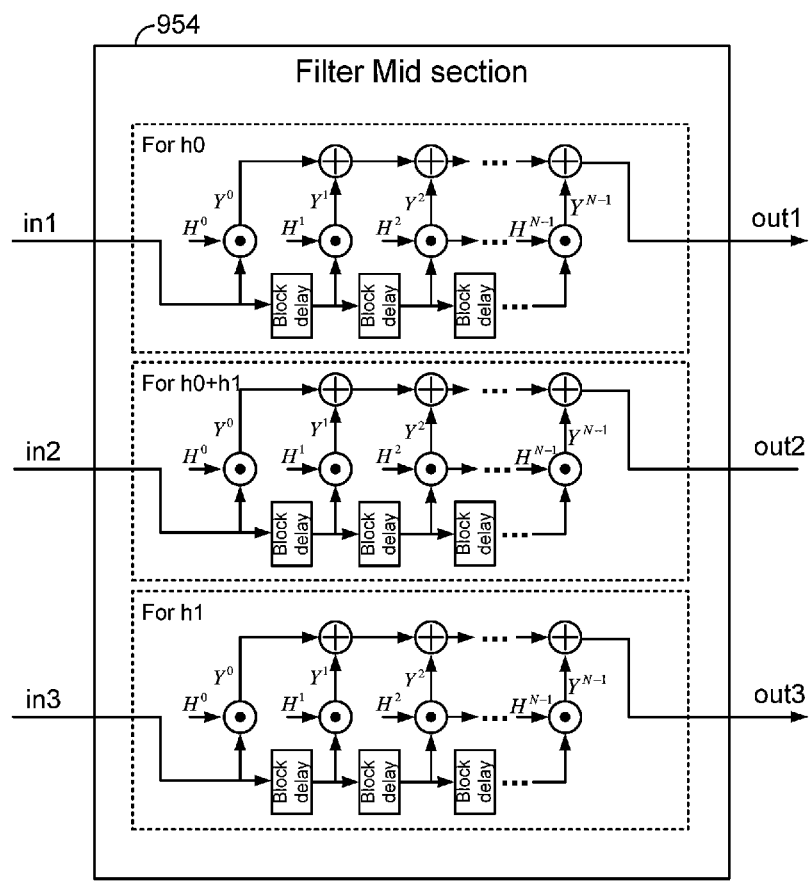
FIG. 21 is a schematic block diagram of a mid section of FIGS. 9-12, and 14.
Figure 22:
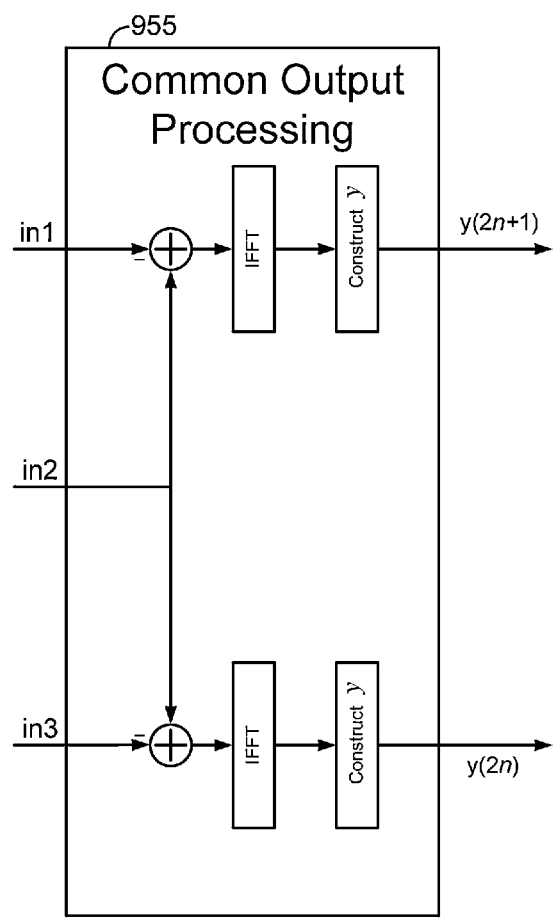
FIG. 22 is a schematic block diagram of an output processing block.
Figure 23:
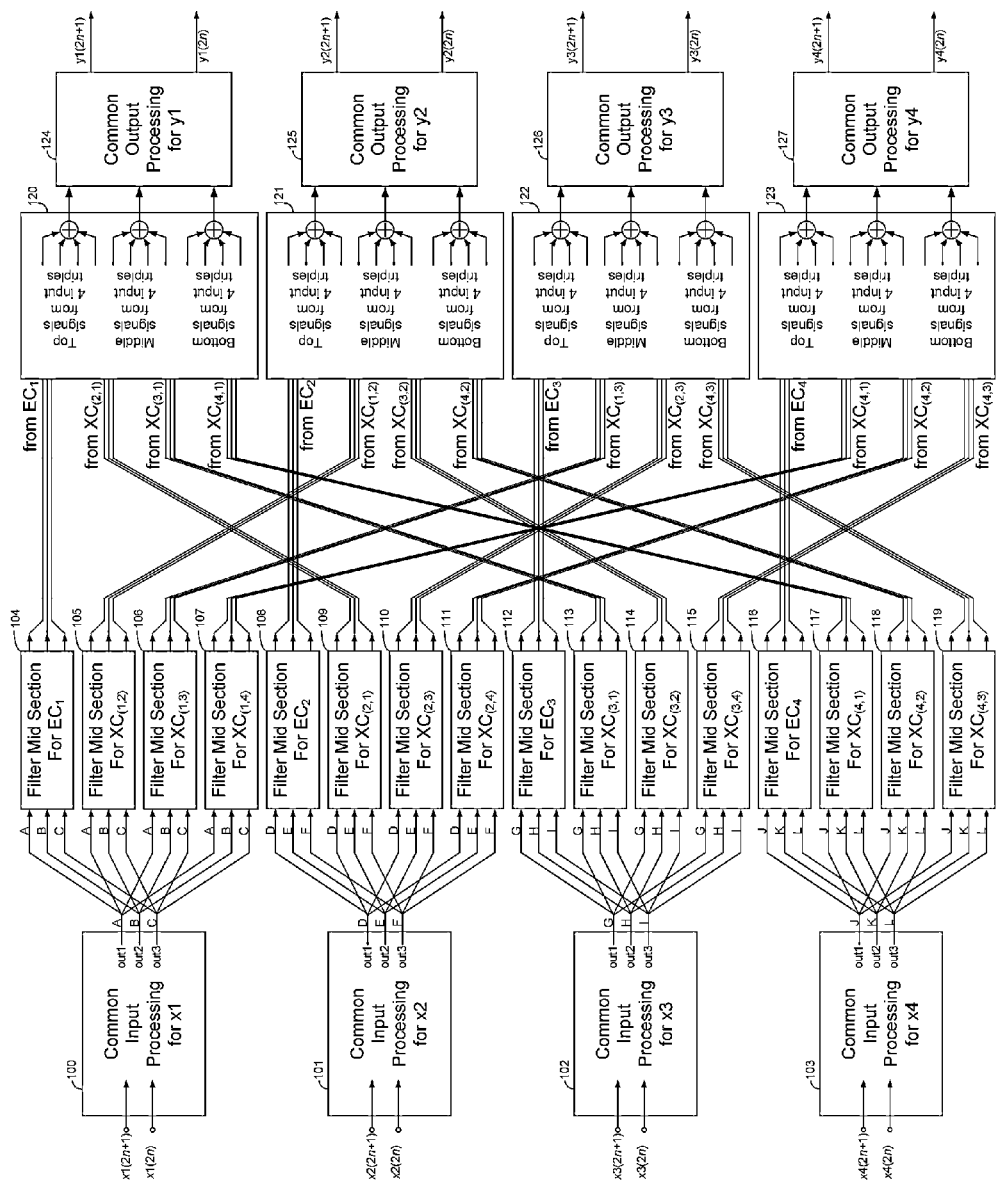
FIG. 23 is a schematic block diagram of an embodiment of a hybrid digital filter with multiple inputs and multiple outputs.

To illustrate one such example of the application of these techniques on the example 4-input 4-output structure of FIG. 19, we use the common input processing section 953 depicted in FIG. 20 based on the RCNP family of FIG. 2b where the post processor is free of any delay elements. The same structure 953 of FIG. 20 is also found in the exemplified hybrid filter structures of FIGS. 7, 7a, 8, 11, 11a, 12, and 15. We also use the Filter Mid-Section 954 depicted in FIG. 21 based on partitioned transform domain processor with block delays at the input. The same structure 954 of FIG. 21 is also found in the exemplified hybrid filter structures of FIGS. 9, 9a, 10, 11, 11a, 12, and 14). We also use the optimized common output processing section 955 of FIG. 22 where the output transforms and output constructors follow the linear operation, yielding an output transform and output construction reduction. The same structure 955 of FIG. 22 is also found in the exemplified hybrid filter structures of FIGS. 8, 12, and 14. We note that if the sub-filter lengths are short and do not justify using a partitioned transform domain processor, one may use a non-partitioned transform domain processor. Using the common input processor 953 of FIG. 20, the filter mid section transform domain processor 954 of FIG. 21, and common output processor 955 of FIG. 22, an exemplary hybrid 4-input 4-output functionally equivalent to that of FIG. 19 is shown in FIG. 23. The structure in FIG. 23 is comprised of 4 common input processors 100 101 102 103 one for each one of the 4 inputs, filter mid-sections 104 through 119 for $EC_i$ and $XC_{(i,j)}$, common stream combiners 120 121 122 123 one for each one of the 4 outputs, and the common output processor 124 125 126 127 each one producing one of the 4 outputs.

Figure 24:
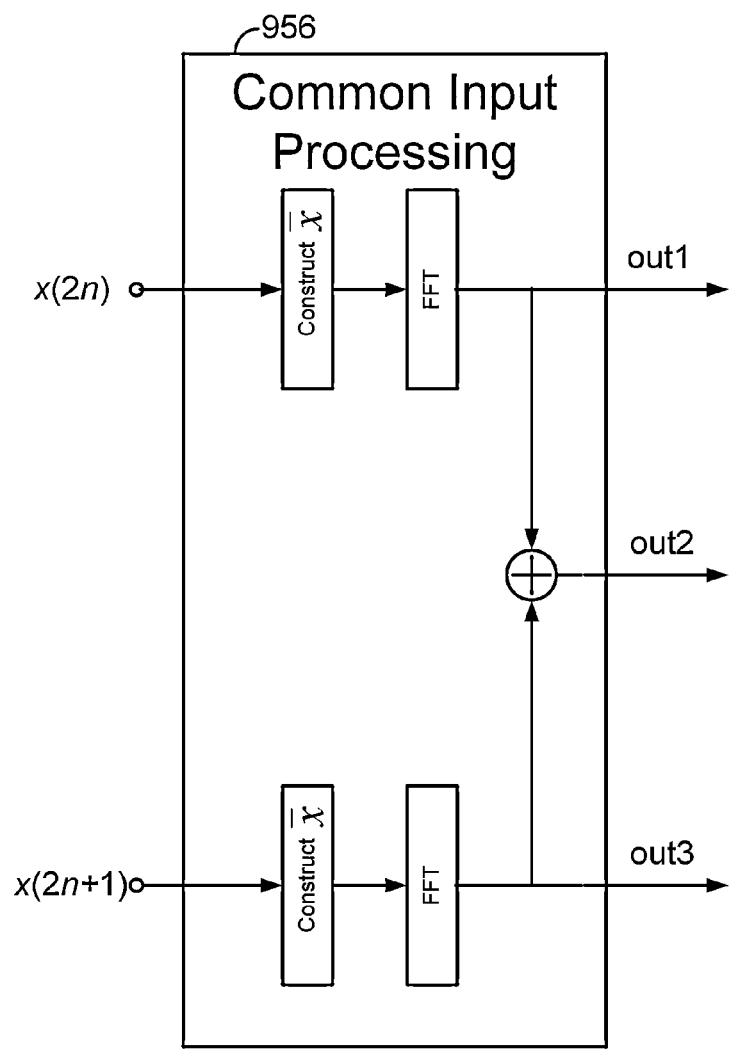
FIG. 24 is a schematic block diagram of an alternative input processing block.
Figure 25:
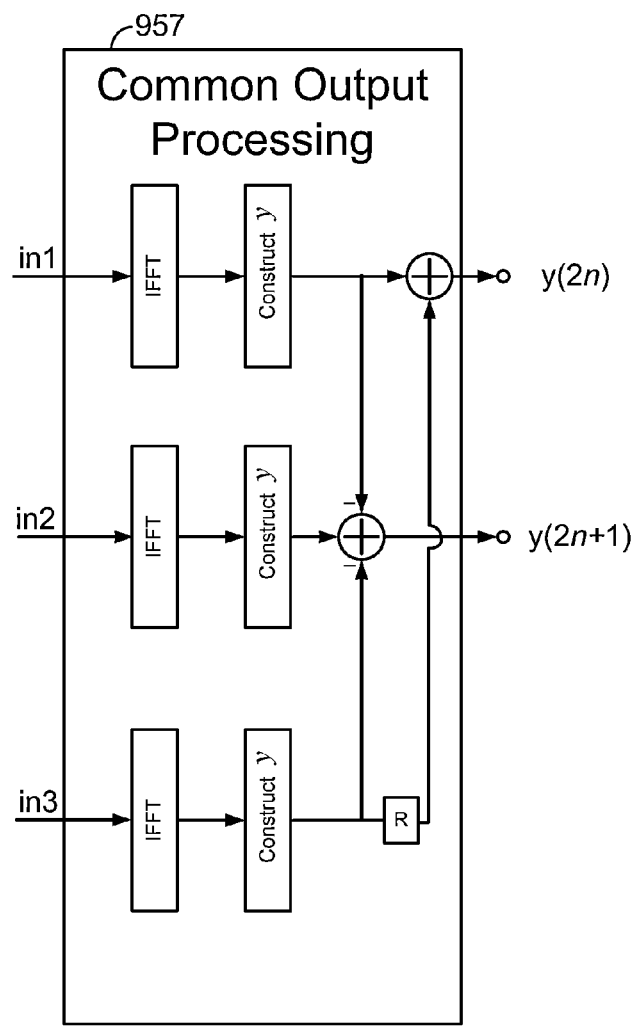
FIG. 25 is a schematic block diagram of an alternative output processing block.

The hybrid optimized structure of FIG. 23 may also be used with structures based on the RCNP family exemplified in FIG. 2a where the pre processor is free of any delay elements. With such choice the common input processor 956 of FIG. 24 may be used for 100 101 102 103 in FIG. 23 and the common output processor 957 of FIG. 25 should be used for 124 125 126 127 in FIG. 23. One should note that the type of common input processor and common output processor used are related, in general they need to be from the same type of RCNP family. The optimized common input processor 956 of FIG. 24, where the input constructors and input transforms are prior to the linear operator yielding input transform and input constructor reduction, is also found in the exemplified hybrid filter structures of FIGS. 6, 10, and 17. The corresponding common output processor 957 of FIG. 25 is also found in the exemplified hybrid filter structures of FIGS. 5, 5a, 6, 9, 9a, 10, and 18. Therefore, in general if a hybrid structure is based on the RCNP family with pre-processor being free of delay elements, any common input processors and any pre-processors may be optimized by having the input transforms and input constructors prior to the linear operation, yielding a potential reduction in the number of input transforms and constructors. Similarly, if a hybrid structure is based on the RCNP family with post-processor being free of delay elements, any common output processors and any post-processors may be optimized by having the output transforms and output constructors follow the linear operation, yielding a potential reduction in the number of output transforms and constructors.

The observations previously made about the input block delays being taken out of the partitioned transform domain processors with block delays at the input and placed in common input processors applies to the most general case of I-input O-output structures. For example it is applicable to the 4-input 4-output structure of FIG. 23, where the block delays from 104 through 119 can be taken out and placed in common input processors 100 through 103 to be shared, yielding a factor of 4 reduction in the number of block delays used. Similarly, block adders may be taken out from the transform domain processor and shared in the common output processors, which may require the common stream combiners to change. Finally, the block delays and block adders may be taken out of the partitioned transform domain processors with block delays towards the output and placed in common output processors also applies to the most general case of I-input O-output structures.

Just as before also in the most general case of I-input O-output case, the choice of non-partitioned, partitioned with block delays at the input, and partitioned with block delays towards the output are not restricted and may differ for one filter and sub-filter to another.

Hybrid Filters for Real-Valued Signals

One should also note that the technique illustrated in Narashimha (M. J. Narasimha, "Modified Overlap—Add and Overlap—Save Convolution Algorithms for Real Signals" in the IEEE SIGNAL PROCESSING LETTERS, VOL. 13, NO. 11, NOVEMBER 2006) which applies to filtering real-valued signals with real-valued filters using complex-valued transforms can be applied to all the applicable filter families and structures disclosed herein. The application of the technique in Narashimha dictates the specific operations of the input and/or output constructors in the structures and may impact the block and/or transform sizes. This technique uses concatenation or input blocks along with overlapping to construct the complex-valued signal from the real-valued signal for processing. The construction of the output signal is also obtained by performing the proper concatenation of real and imaginary blocks of the processed signal to form the real-valued output. The technique can also be applied to the cases of real-valued signal(s) being processed by complex-valued impulse response(s), and complex-valued signal(s) being processed by real-valued impulse response(s). The application of the technique in Narashimha to any of the filter families described herein is evident to one skilled in the art. It is also evident to one skilled in the art that any of the filter families described herein where complex-valued signals are used can be applied to real-valued signals by constructing the complex valued counterpart by setting the real-valued part of the complex signal to the real signal and setting the imaginary-valued part of the signal to zero. Similar construction applies to imaginary-only valued sigals.

Example Application in 10GBaseT

In a 10GBaseT application a 4-input 4-output system is utilized for Echo and Crosstalk cancellation. This system is depicted in FIG. 19. Let us assume the EC filter lengths are 1024, and the XC filter lengths are 256. Let us also assume that the throughput rates of the 4 inputs are 800 MSPS and the throughput rates of the 4 outputs are 800 MSPS. The following exemplary choices would yield an architecture based on the techniques described here that would produce an efficient implementation of this system. Using the general structure of FIG. 23 but applying Reduced Complexity 4-parallel structures in the common input processors along with the technique described in Narashimha will yield common input processors which generate 9 complex valued streams at the outputs of each common input processor and each one of these streams would have a throughput rate of 200 MSPS. One can think of the reduced complexity 4-parallel common input processing to be two stages of recursive application of reduced complexity 2-parallel input processing. The Reduced Complexity 2-parallel input processing generates 3 streams (see FIG. 2*a* and FIG. 2*b*). Applying the Reduced complexity 2-parallel input processing to each one of the 3 outputs again, will yield the 9 streams. Similar idea applies to the common output processor. Note that it is very feasible that each of the 800 MSPS inputs would be fed to the system at 200 MSPS by inputting 4 real-valued samples at a time. In this case the common input processing blocks would be operating at 200 MSPS, by receiving 4 real-valued streams and generating 9 complex-valued streams. For the EC filters there would be 9 sub-filters, each one of them having length of 1024/4=256. To utilize the common input processing technique fully, the XC filters may also have 9 sub-filters, each one of them having length 256/4=64. Let us assume we will use transforms size of 128 such that each transform block is suitable for a 64 tap filter processing. This means for the EC sub-filters we may use partitioned filter mid sections with N=256/64=4 partitions, utilizing 413 (FIG. 4*c*), which is 434 with N=4 (FIG. 4*e*) or utilizing 453 (FIG. 4*d*), which is 473 with N=4 (FIG. 4*f*). Since the XC sub-filters are 64 taps and the transform size is suitable for 64 long block filtering, the XC sub-filters may be non-partitioned, utilizing 330 (FIG. 3), which is 434 (FIG. 4*e*) and 473 (FIG. 4*f*) with N=1. The filter mid-section outputs are combined accordingly and presented to the common output processing blocks to generate the outputs. The discussed block delays and block adders being pushed into the common input processors and/or common output processors may be considered. Finally the real-valued outputs are obtained by concatenating the real and imaginary parts of the complex signal obtained at every block-processing iteration. It will be evident to one skilled in the art that using the technique in Narasimha may allow the forward transform for the XC sub-filters to run at half the rate (due to the technique in Narasimha). This means the filter mid-section and output processing blocks corresponding to the XC filters would take every other transform block at the output of the input processor (to still share the transform blocks processing the inputs used by both EC and XC sub-filters). The output processing for all filters may be done at half the block rate of the forward transform required for the EC filters. Therefore, it may be beneficial to pick the input and output processing blocks where input transforms in the input processor are reduced (like in FIG. 24), and use resource sharing for the output transforms required for the output generation. Basing the described 4-input 4-output system on Reduced Complexity 4 parallel time domain structures, the overall structure of the hybrid filter will be similar to that of FIG. 23, with common input processing blocks having 4 inputs at 200 MSPS each (representing the 800 MSPS input stream) and 9 outputs each at 200 MSPS. The Filter Mid-Sections will receive 9 inputs at 200 MSPS and produce 9 outputs at 200 MSPS. Each one of the combiner blocks between the filter mid-section blocks and the output processing blocks will receive 4 groups of 9 signals at 200 MSPS each (instead of 4 groups of 3 signals) and will similarly generate 9 signals at 200 MSPS each. Each one of the common output processors will take their corresponding 9 signals and generate 4 streams at 200 MSPS each, collectively constituting the corresponding 800 MSPS output.

It will be evident to one skilled in the art that various configurations are available by utilizing resource sharing by processing at higher rates and/or reducing the processing speed by resource duplication.

Some applications that are well suited for the filter families described herein exists in emerging 40G, 100G and many other applications.

Finally, it should be noted that in various embodiments, digital FIR filters have been used for illustration purposes and any method described herein may also apply to analog, optical, IIR filtering, or any other type of filters. In addition, in various embodiments, certain decompositions have been used as examples for illustrative purposes, however, the present invention is not limited to these examples.

Although the present invention has been described in detail with respect to certain embodiments and examples, variations and modifications exist which are within the scope of the present invention as defined in the following claims.

What is claimed is:

1. A digital filter comprising:
   a plurality of first time domain elements, each acting on one of a plurality of main input streams, generating a plurality of first streams, wherein each of said plurality of first streams has a sample rate which is less than that of said corresponding main input stream;

a plurality of hybrid filter sections, wherein a said hybrid filter section is comprised of a) a hybrid filter section pre-processor for processing said plurality of first streams to produce a plurality of second streams, said hybrid filter section pre-processor performing at least one linear operation, and b) a hybrid filter section processor performing processing on said plurality of second streams to produce a plurality of third streams, wherein at least one of said hybrid filter section processor of said plurality of hybrid filter sections is a transform domain processor;

a combiner for processing based on said plurality of third streams to produce a plurality of fourth streams;

a post-processor for processing based on said plurality of fourth streams to produce a plurality of fifth streams, said post-processor performing at least one linear operation and said processing of post-processor corresponds to said processing of said hybrid filter section pre-processor;

a single element delay in at least one of said hybrid filter section pre-processor or said post-processor; and a second time domain element producing a main output stream by acting on said plurality of fifth streams.

2. The digital filter of claim 1, wherein said pre-processor comprises:
an input constructor; and
an input transform.

3. The digital filter of claim 2, wherein said input constructor and said input transform act on said plurality of first streams prior to said at least one linear operation.

4. The digital filter of claim 3 wherein said transform domain processor is a partitioned transform domain processor.

5. The digital filter of claim 4 wherein said combiner for processing based on said plurality of third streams to produce a plurality of fourth streams comprises of at least one linear operation.

6. The digital filter of claim 1 wherein said post-processor comprises:
an output transform; and
an output constructor.

7. The digital filter of claim 6, wherein said output transform and said output constructor act on said plurality of third streams after said at least one linear operation.

8. The digital filter of claim 7 wherein said transform domain processor is a partitioned transform domain processor.

* * * * *